United States Patent
Ota et al.

(10) Patent No.: US 9,761,437 B2
(45) Date of Patent: Sep. 12, 2017

(54) METHOD OF MANUFACTURING SEMICONDUCTOR DEVICE, SUBSTRATE PROCESSING METHOD AND SUBSTRATE PROCESSING APPARATUS

(71) Applicant: HITACHI KOKUSAI ELECTRIC INC., Tokyo (JP)

(72) Inventors: Yosuke Ota, Ome (JP); Yoshiro Hirose, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/803,336

(22) Filed: Jul. 20, 2015

(65) Prior Publication Data

US 2015/0325427 A1 Nov. 12, 2015

Related U.S. Application Data

(63) Continuation of application No. 14/006,819, filed as application No. PCT/JP2012/055832 on Mar. 7, 2012, now Pat. No. 9,123,530.

(30) Foreign Application Priority Data

Mar. 23, 2011 (JP) .................................. 2011-064726

(51) Int. Cl.
H01L 21/465 (2006.01)
H01L 21/02 (2006.01)
(Continued)

(52) U.S. Cl.
CPC ........ *H01L 21/02118* (2013.01); *C23C 16/30* (2013.01); *C23C 16/308* (2013.01);
(Continued)

(58) Field of Classification Search
CPC ..... C23C 14/04; C23C 16/0218; C23C 16/36; H01L 21/28562; H01L 21/32051;
(Continued)

(56) References Cited

U.S. PATENT DOCUMENTS 6,211,096 B1 * 4/2001 Allman ............. H01L 21/02131
257/310
6,534,442 B1 3/2003 Vaughn et al.
(Continued)

FOREIGN PATENT DOCUMENTS

JP 2005-159316 A 6/2005
JP 2006-054432 A 2/2006
(Continued)

OTHER PUBLICATIONS

Jan. 20, 2015 Office Action issued in Japanese Application No. 2014-070517.
(Continued)

*Primary Examiner* — Kimberly Rizkallah
*Assistant Examiner* — Brian Turner
(74) *Attorney, Agent, or Firm* — Oliff PLC

(57) ABSTRACT

Provided are: forming an oxycarbonitride film, an oxycarbide film or an oxide film on a substrate by alternately performing a specific number of times: forming a first layer containing the specific element, nitrogen and carbon, on the substrate, by alternately performing a specific number of times, supplying a first source containing the specific element and a halogen-group to the substrate in a processing chamber, and supplying a second source containing the specific element and an amino-group to the substrate in the processing chamber; and forming a second layer by oxidizing the first layer by supplying an oxygen-containing gas, and an oxygen-containing gas and a hydrogen-containing gas to the substrate in the processing chamber.

16 Claims, 11 Drawing Sheets

(51) Int. Cl.
*H01L 21/314* (2006.01)
*H01L 21/365* (2006.01)
*C23C 16/52* (2006.01)
*C23C 16/455* (2006.01)
*C23C 16/30* (2006.01)
*C23C 16/40* (2006.01)

(52) U.S. Cl.
CPC ...... *C23C 16/401* (2013.01); *C23C 16/45523* (2013.01); *C23C 16/45525* (2013.01); *C23C 16/45546* (2013.01); *C23C 16/45561* (2013.01); *C23C 16/52* (2013.01); *H01L 21/0214* (2013.01); *H01L 21/0223* (2013.01); *H01L 21/0228* (2013.01); *H01L 21/02126* (2013.01); *H01L 21/02164* (2013.01); *H01L 21/02211* (2013.01); *H01L 21/02219* (2013.01); *H01L 21/02271* (2013.01); *H01L 21/02252* (2013.01); *H01L 21/02255* (2013.01)

(58) Field of Classification Search
CPC ......... H01L 21/76814; H01L 21/76826; H01L 21/76843
USPC ............... 427/569, 255.28; 438/761, 762
See application file for complete search history.

(56) References Cited

U.S. PATENT DOCUMENTS

| | | | |
|---|---|---|---|
| 2001/0024387 A1 | 9/2001 | Raaijmakers et al. | |
| 2005/0167768 A1* | 8/2005 | Yamaguchi | C23C 16/308 257/410 |
| 2006/0032442 A1* | 2/2006 | Hasebe | C03C 17/245 118/715 |
| 2006/0205186 A1 | 9/2006 | Park et al. | |
| 2007/0111538 A1* | 5/2007 | Iyer | C23C 16/345 438/778 |
| 2008/0026251 A1 | 1/2008 | Suzuki et al. | |
| 2008/0213479 A1 | 9/2008 | Chou et al. | |
| 2009/0170345 A1* | 7/2009 | Akae | H01L 21/0214 438/786 |
| 2010/0075479 A1* | 3/2010 | Kim | H01L 21/76224 438/424 |
| 2010/0129994 A1 | 5/2010 | Awad et al. | |
| 2010/0130024 A1* | 5/2010 | Takasawa | C23C 16/45531 438/761 |
| 2011/0256726 A1* | 10/2011 | LaVoie | C23C 16/045 438/702 |
| 2013/0052836 A1 | 2/2013 | Hirose et al. | |

FOREIGN PATENT DOCUMENTS

| | | |
|---|---|---|
| JP | 2008-053683 A | 3/2008 |
| JP | 2008-227460 A | 9/2008 |
| JP | 2009-532881 A | 9/2009 |
| JP | 2011-504651 A | 2/2011 |
| JP | 2013-504875 A | 2/2013 |
| JP | 5374638 B2 | 12/2013 |
| WO | 2011/031591 A1 | 3/2011 |
| WO | 2011/125395 A1 | 10/2011 |

OTHER PUBLICATIONS

Apr. 24, 2012 Search Report issued in International Application No. PCT/JP2012/055832.

* cited by examiner

METHOD OF MANUFACTURING SEMICONDUCTOR DEVICE, SUBSTRATE PROCESSING METHOD AND SUBSTRATE PROCESSING APPARATUS

CONTINUITY DATA

This is a Continuation of application Ser. No. 14/006,819 filed Oct. 29, 2013, which in turn is a National Stage of International Application No. PCT/JP2012/055832 filed Mar. 7, 2012, which claims the benefit of Japanese Application No. 2011-064726 filed Mar. 23, 2011. The disclosure of the prior applications is hereby incorporated by reference herein in its entirety.

TECHNICAL FIELD

The present invention relates to a method of manufacturing a semiconductor device including a step of forming a thin film on a substrate, a substrate processing method and a substrate processing apparatus.

DESCRIPTION OF RELATED ART

A high resistance to hydrogen fluoride (HF) and low dielectric constant are required for a thin film such as an insulating film constituting a side wall spacer (SWS) of a gate electrode. Therefore, a silicon carbonitride film (SiCN film) in which carbon (C) is added to a silicon nitride film (SiN film), or a silicon oxycarbonitride film (SiOCN film), etc., in which oxygen (O) is further added thereto, is used as the insulating film. A high step coverage characteristic is requested for these insulating films, and therefore these insulating films are formed in many cases not by a general CVD (Chemical Vapor Deposition) method of simultaneously supplying processing gases, but an alternately supplying method such as ALD (Atomic Layer Deposition) method, etc., of alternately supplying processing gases.

SUMMARY OF THE INVENTION

Problem to be Solved by the Invention

In order to further improve the resistance to HF, or further reducing the dielectric constant of the insulating films such as the SiCN film and the SiOCN film, it is effective to reduce a nitrogen concentration, or increase a carbon concentration, or increase an oxygen concentration in a film. However, in a conventional alternately supplying method, it is difficult to form a film with the carbon concentration exceeding the nitrogen concentration for example. Further, a lower film formation temperature is requested for forming the insulating film constituting the side wall spacer, etc. However, the film formation temperature in the conventional alternately supplying method is around 600° C., and it is difficult to form the thin film such as the above-mentioned insulating film, etc., in a low temperature zone of 550° C. or less for example.

Accordingly, an object of the present invention is to provide a method of manufacturing a semiconductor device, a substrate processing method, and a substrate processing apparatus, capable of forming an excellent thin film in a low temperature zone.

Means for Solving the Problem

According to an aspect of the present invention, there is provided a method of manufacturing a semiconductor device, including:

forming an oxycarbonitride film, an oxycarbide film or an oxide film containing a specific element on a substrate by alternately performing a specific number of times:

forming a first layer containing the specific element, nitrogen and carbon, on the substrate, by alternately performing a specific number of times, supplying a first source containing the specific element and a halogen-group to the substrate in a processing chamber, and supplying a second source containing the specific element and an amino-group to the substrate in the processing chamber; and forming a second layer by oxidizing the first layer by supplying an oxygen-containing gas, or an oxygen-containing gas and a hydrogen-containing gas to the substrate in the processing chamber.

According to other aspect of the present invention, there is provided a substrate processing method, including:

forming an oxycarbonitride film, an oxycarbide film or an oxide film containing a specific element on a substrate by alternately performing a specific number of times:

forming a first layer containing the specific element, nitrogen and carbon, on the substrate, by alternately performing a specific number of times, supplying a first source containing the specific element and a halogen-group to the substrate in a processing chamber, and supplying a second source containing the specific element and an amino-group to the substrate in the processing chamber; and forming a second layer by oxidizing the first layer by supplying an oxygen-containing gas, or an oxygen-containing gas and a hydrogen-containing gas to the substrate in the processing chamber.

According to further other aspect of the present invention, there is provided a substrate processing apparatus, including:

a processing chamber configured to house a substrate;

a first source supply system configured to supply a first source containing a specific element and a halogen-group, to a substrate in the processing chamber;

a second source supply system configured to supply a second source containing the specific element and an amino-group, to a substrate in the processing chamber:

a reaction gas supply system configured to supply an oxygen-containing gas, or an oxygen-containing gas and a hydrogen-containing gas, to a substrate in the processing chamber; and a control part configured to control the first source supply system, the second source supply system and the reaction gas supply system, so that an oxycarbonitride film, an oxycarbide film or an oxide film containing the specific element, is formed on a substrate, by alternately performing a specific number of times, a process of forming a first layer containing the specific element, nitrogen and carbon on the substrate by alternately performing a specific number of times a process of supplying the first source to the substrate in the processing chamber, and a process of supplying the second source to the substrate in the processing chamber; and a process of forming a second layer by oxidizing the first layer by supplying the oxygen-containing gas, or the oxygen-containing gas and the hydrogen-containing gas to the substrate in the processing chamber.

Advantage of the Invention

According to the present invention, there are provided a method of manufacturing a semiconductor device, a substrate processing method, and a substrate processing apparatus, capable of forming an excellent thin film in a low temperature zone.

MODES FOR CARRYING OUT THE INVENTION

Embodiments of the present invention will be described hereafter, based on the drawings.

Figure 1:
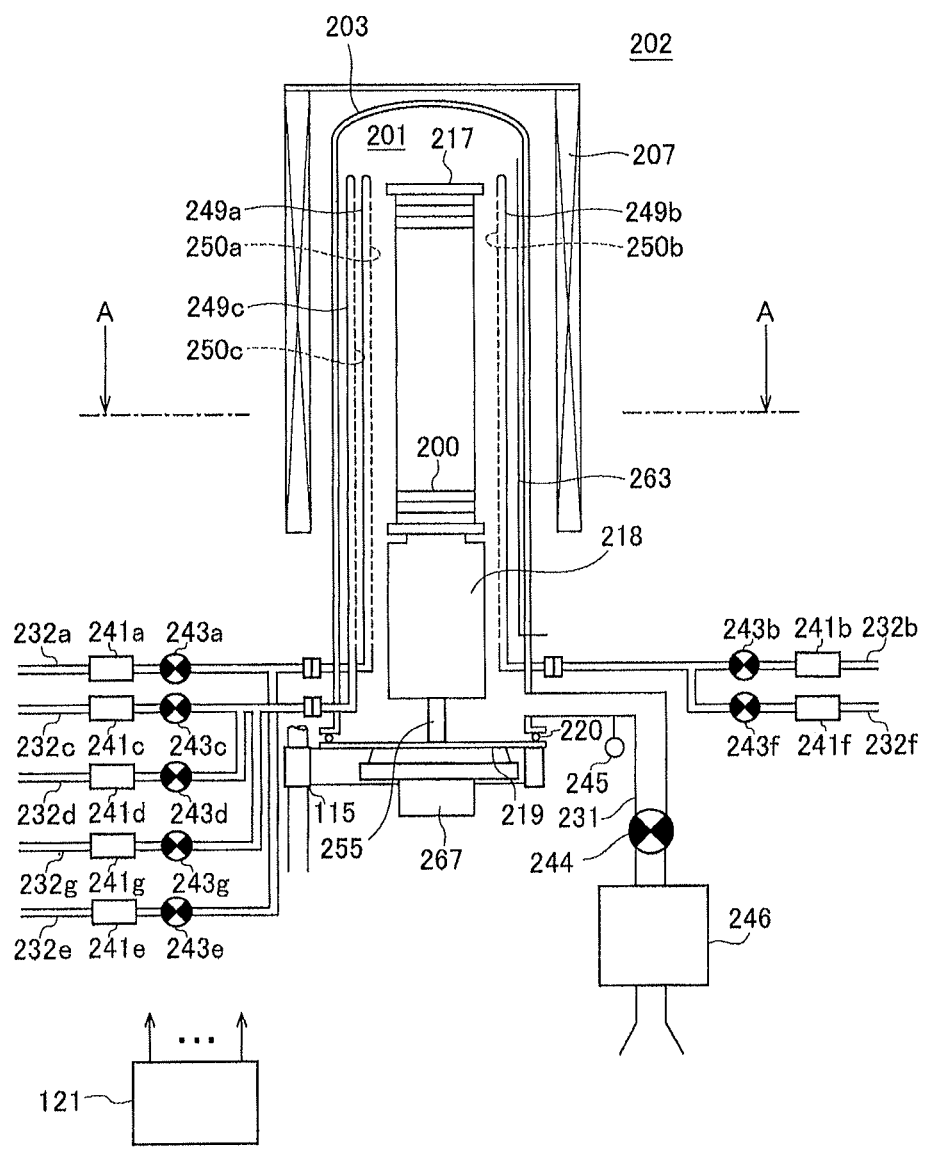
FIG. 1 is a schematic block diagram of a vertical-type processing furnace of a substrate processing apparatus suitably used in this embodiment, and a view showing a processing furnace portion in a vertical sectional view.
Figure 2:
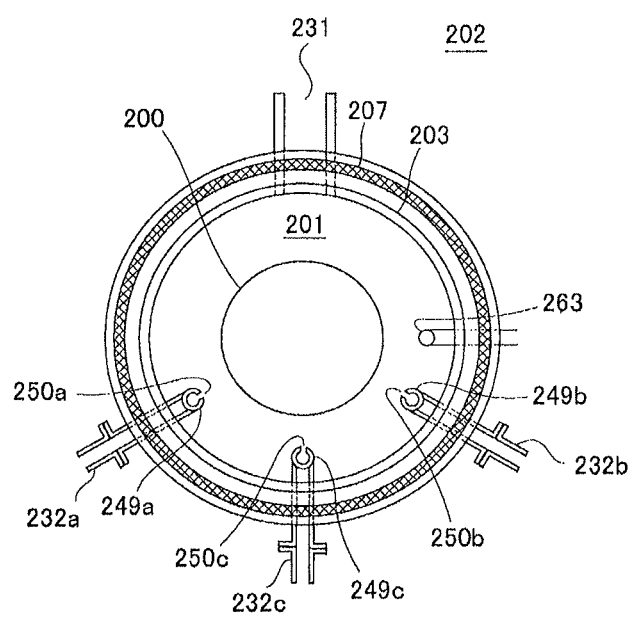
FIG. 2 is a schematic block diagram of the vertical-type processing furnace of the substrate processing apparatus suitably used in this embodiment, and a view showing the processing furnace portion taken along the line A-A of FIG. 1.

FIG. 1 is a schematic block diagram of a vertical-type processing furnace of a substrate processing apparatus suitably used in this embodiment, and shows a processing furnace 202 portion in a vertical sectional view, and FIG. 2 is a schematic block diagram of the vertical-type processing furnace suitably used in this embodiment, and a view showing the processing furnace portion taken along the line A-A of FIG. 1

As shown in FIG. 1, the processing furnace 202 has a heater 207 as a heating unit (heating mechanism). The heater 207 has a cylindrical shape, and is vertically installed on a heater base (not shown) as a holding plate by being supported thereby. The heater 207 also functions as an activation mechanism of activating a gas by heat as will be described later. The heater 207 also functions as an activation mechanism of activating a gas by heat as will be described later.

A reaction tube 203 constituting a reaction vessel (processing vessel) is disposed inside of the heater 207 concentrically with the heater 207. The reaction tube 203 is made of a heat-resistant material such as quartz ($SiO_2$) or silicon carbide (SiC), etc., for example, and is formed into a cylindrical shape, with an upper end closed and a lower end opened. A processing chamber 201 is formed in a cylinder hollow part of the reaction tube 203, so that wafers 200 being substrates, can be stored by a boat in a state of being vertically arranged in multiple stages in a horizontal posture.

A first nozzle 249a, a second nozzle 249b, and a third nozzle 249c are provided in the processing chamber 201 so as to pass through a lower part of the reaction tube 203. A first gas supply tube 232a, a second gas supply tube 232b, and a third gas supply tube 232c are respectively connected to the first nozzle 249a, the second nozzle 249b, and the third nozzle 249c. Further, a fourth gas supply tube 232d is connected to the third gas supply tube 232c. Thus, three nozzles 249a, 249b, 249c, and four gas supply tubes 232a, 232b, 232c, 232d are provided on the reaction tube 203, so that a plurality of kinds of gases, four kinds of gases here, can be supplied into the processing chamber 201.

A metal manifold for supporting the reaction tube 203 may be provided in a lower part of the reaction tube 203, and each nozzle may be provided so as to pass through a side wall of the metal manifold. In this case, an exhaust tube 231 described later may further be provided in this metal manifold. In this case as well, the exhaust tube 231 may be provided not on the metal manifold, but in the lower part of the reaction tube 203. Thus, a furnace throat portion of the processing furnace 202 may be made of metal, and a nozzle, etc., may be attached to the metal furnace throat portion.

A mass flow controller (MFC) 241a being a flow rate control unit (flow rate control part) and a valve 243a being an open/close valve are provided on the first gas supply tube 232a sequentially from an upstream direction. Further, a first inert gas supply tube 232e is connected to a downstream side of the valve 243a of the first gas supply tube 232a. A mass flow controller 241e being a flow rate control unit (flow rate control part), and a valve 243e being an open/close valve are provided on the first inert gas supply tube 232e sequentially from the upstream direction. Further, the above-mentioned first nozzle 249a is connected to a tip part of the first gas supply tube 232a. The first nozzle 249a is provided in an arc-shaped space between an inner wall of the reaction tube 203 and the wafers 200, extending from a lower part to an upper part of the inner wall of the reaction tube 203, so as to rise toward an upper part of a stacking direction of the wafers 200. Namely, the first nozzle 249a is provided in a region horizontally surrounding a wafer arrangement region in which the wafers 200 are arranged, at a side part of the wafer arrangement region, along the wafer arrangement region. The first nozzle 249a is formed as an L-shaped long nozzle, with its horizontal part provided so as to pass through a lower side wall of the reaction tube 203, and with its vertical part provided so as to rise from at least one end side toward the other end side of the wafer arrangement region. Gas supply holes 250a for supplying a gas, are provided on a side face of the first nozzle 249a. Each gas supply hole 250a is opened to face a center of the reaction tube 203, so that the gas can be supplied toward the wafers 200. A plurality of gas supply holes 250a are provided extending from a lower part to an upper part of the reaction tube 203, each of them having the same opening area and provided at the same opening pitch. A first gas supply system is mainly constituted of the first gas supply tube 232a, the mass flow controller 241a, the valve 243a, and the first nozzle 249a. Also, a first inert gas supply system is mainly constituted of the first inert gas supply tube 232e, the mass flow controller 241e, and the valve 243e.

A mass flow controller (MFC) 241b being a flow rate control unit (flow rate control part), and a valve 243b being an open/close vale, are provided on the second gas supply tube 232b, sequentially from the upstream direction. Further, a second inert gas supply tube 232f is connected to a downstream side of the valve 243b of the second gas supply tube 232b. A mass flow controller 241f, and a valve 243f being the open/close valve are provided on the second inert gas supply tube 232f sequentially from the upstream direction. Further, the second nozzle 249b is connected to an edge portion of the second gas supply tube 232b. The second nozzle 249b is provided in the arc-shaped space between the inner wall of the reaction tube 203 and the wafers 200, extending from the lower part to the upper part of the inner wall of the reaction tube 203, so as to rise toward the upper part of the stacking direction of the wafers 200. Namely, the second nozzle 249b is provided in the region horizontally surrounding the wafer arrangement region, at the side part of the wafer arrangement region in which the wafers 200 are arranged, along the wafer arrangement region. The second nozzle 249b is formed as an L-shaped long nozzle, with its horizontal part provided so as to pass through the lower side wall of the reaction tube 203, and with its vertical part provided so as to rise from at least one end side toward the other end side of the wafer arrangement region. Gas supply holes 250b for supplying a gas, are provided on a side face of the second nozzle 249b. Each gas supply hole 250b is opened to face the center of the reaction tube 203, so that the gas can be supplied toward the wafers 200. A plurality of gas supply holes 250b are provided extending from the lower part to the upper part of the reaction tube 203, each of them having the same opening area and provided at the same opening pitch. A second gas supply system is mainly constituted of the second gas supply tube 232b, the mass flow controller 241b, the valve 243b, and the second nozzle 249b. Also, a second inert gas supply system is mainly constituted of the second inert gas supply tube 232f, the mass flow controller 241f, and the valve 243f.

A mass flow controller (MFC) 241c being a flow rate control unit (flow rate control part), and a valve 243c being an open/close valve, are provided on the second gas supply tube 232c, sequentially from the upstream direction. Further, a fourth gas supply tube 232d is connected to a downstream side of the valve 243c of the third gas supply tube 232c. A mass flow controller 241d, and a valve 243d being the open/close valve are provided on the fourth gas supply tube 232d sequentially from the upstream direction. Further, a third inert gas supply tube 232g is connected to the downstream side of a connection part connected to the fourth gas supply tube 232d on the third gas supply tube 232c. A mass flow controller 241g being the flow rate control unit (flow rate control part), and a valve 243g being the open/close valve, are provided on the third inert gas supply tube 232g. Further, the above-mentioned third nozzle 249c is connected to the edge portion of the third gas supply tube 232c. The third nozzle 249c is provided in the arc-shaped space between the inner wall of the reaction tube 203 and the wafers 200, extending from the lower part to the upper part of the inner wall of the reaction tube 203, so as to rise toward the upper part of the stacking direction of the wafers 200. Namely, the second nozzle 249c is provided in the region horizontally surrounding the wafer arrangement region in which the wafers 200 are arranged, at the side part of the wafer arrangement region, along the wafer arrangement region. The third nozzle 249c is formed as the L-shaped long nozzle, with its horizontal part provided so as to pass through the lower side wall of the reaction tube 203, and with its vertical part provided so as to rise from at least one end side toward the other end side of the wafer arrangement region. Gas supply holes 250c for supplying gas, are provided on a side face of the third nozzle 249c. Each gas supply hole 250c is opened to face the center of the reaction tube 203, so that the gas can be supplied toward the wafers 200. A plurality of gas supply holes 250c are provided extending from the lower part to the upper part of the reaction tube 203, each of them having the same opening area and provided at the same opening pitch. A third gas supply system is mainly constituted of the third gas supply tube 232c, the mass flow controller 241c, the valve 243c, and the third nozzle 249c. Also, a fourth gas supply system is mainly constituted of the fourth gas supply tube 232d, the mass flow controller 241d, the valve 243d, and the third nozzle 249c. Further, a third inert gas supply system is mainly constituted of the third inert gas supply tube 232g, the mass flow controller 241g, and the valve 243g.

Thus, in the method of supplying gas according to this embodiment, gas is transferred through nozzles 249a, 249b, 249c disposed in the arc-shaped vertically long space defined by the inner wall of the reaction tube 203 and edge portions of the plurality of stacked wafers 200, and the gas is sprayed into the reaction tube 203 for the first time in the vicinity of the wafers 200 from the gas supply holes 250a, 250b, 250c which are opened on the nozzles 249a, 249b, 240c respectively, so that the gas flows mainly in parallel to the surface of the wafers 200, namely in a horizontal direction. With this structure, the following effect can be obtained. Namely, the gas can be uniformly supplied to each wafer 200, and a film thickness of the thin film formed on each wafer 200 can be equalized. The gas flowing on the surface of the wafers 200, namely a remained gas after reaction flows toward an exhaust port, namely in a direction of the exhaust tube 231 described later. However, the direction of the flow of such a remained gas is suitably specified by a position of the exhaust port and is not limited to the vertical direction.

A chlorosilane-based source gas being a first source gas containing at least a silicon (Si) element and a chloro-group, is supplied from the first gas supply tube 232a into the processing chamber 201 through the mass flow controller 241a, the valve 243a, and the first nozzle 249a, as a first source containing a specific element and a halogen-group. Wherein, the chlorosilane-based source means a silane-based source having the chloro-group, and means the source containing at least silicon (Si) and chlorine (Cl). As the chlorosilane-based source gas, for example, a hexachlorodisilane ($Si_2Cl_6$, abbreviated as HCDS) gas can be used. When a liquid source in a liquid state under normal temperature and pressure like the HCDS is used, the liquid source is vaporized by a vaporization system such as a vaporizer or a bubbler, etc., and is supplied as the source gas (HCDS gas).

As a second source containing the specific element and an amino-group (amine-group), an aminosilane-based source gas being the second source gas containing at least silicon (Si) element and the amino-group, is supplied into the processing chamber 201 from the second gas supply tube 232b through the mass flow controller 241b, the valve 243b, and the second nozzle 249b. Wherein, the aminosilane-based source means a silane-based source having the amino-group (this is also the silane-based source containing a methyl-group and an ethyl group), which is the source containing at least silicon (Si), nitrogen (N) and carbon (C). As the aminosilane-based source gas, for example trisdim-ethylaminosilane (S[N(CH$_3$)$_2$]$_3$H, abbreviated as 3DMAS) gas can be used. When using the liquid source in the liquid state at normal temperature and pressure like 3DMAS, the liquid source is vaporized by the vaporization system such as the vaporizer and the bubbler, etc., and is supplied as the source gas (3DMAS gas).

For example, the gas containing oxygen (O) (oxygen-containing gas) is supplied into the processing chamber 201 from the third gas supply tube 232c through the mass flow controller 241c, the valve 243c, and the third nozzle 249c. For example, an oxygen (O$_2$) gas can be used as the oxygen-containing gas.

For example, the gas containing hydrogen (H) (hydrogen-containing gas) is supplied into the processing chamber 201 from the fourth gas supply tube 232d through the mass flow controller 241d, the valve 243d, and the third gas supply tube 232c, and the third nozzle 249c. For example, a hydrogen (H$_2$) gas can be used as the hydrogen-containing gas.

For example a nitrogen (N$_2$) gas is supplied into the processing chamber 201 from the inert gas supply tubes 232e, 232f, 232g, through the mass flow controllers 241e, 241f, 241g, the valves 243e, 243f, 243g, the gas supply tubes 232a, 232b, 232c, and the gas nozzles 249a, 249b, 249c.

For example, when the gas like the above-mentioned gas is flowed from each gas supply tube, a first source supply system for supplying the first source containing the specific element and the halogen-group, namely, a chlorosilane-based source gas supply system as the first source gas supply system is constituted by the first gas supply system. Further, a second source supply system for supplying the second source containing the specific element and the amino-group, namely an aminosilane-based source gas supply system as the second source gas supply system is constituted by the second gas supply system. The chlorosilane-based source gas supply system and the aminosilane-based source gas supply system are also simply called a chlorosilane-based source supply system respectively, and an aminosilane-based source supply system respectively. Further, an oxygen-containing gas supply system is constituted by the third gas supply system. Also, a hydrogen-containing gas supply system is constituted by the fourth gas supply system. When the oxygen-containing gas and the hydrogen-containing gas are generally called a reaction gas, a reaction gas supply system is constituted by the oxygen-containing gas supply system and the hydrogen-containing gas supply system.

The exhaust tube 231 for exhausting the atmosphere in the processing chamber 201 is provided on the reaction tube 203. As shown in FIG. 2, the exhaust tube 231 is provided on a side opposed to the side where the gas supply holes 250a of the first nozzle 249a and the gas supply holes 250b of the second nozzle 249b of the reaction tube 203 are provided, namely on the opposite side to the gas supply holes 250a, 250b with the wafers 200 interposed between them, in cross-sectional view. Further, as shown in FIG. 1 in a vertical sectional view, the exhaust tube 231 is provided below the part where the gas supply holes 250a, 250b are provided. With this structure, the gas supplied in the vicinity of the wafers 200 in the processing chamber 201 from the gas supply holes 250a, 250b, flows in the horizontal direction, namely in parallel to the surface of the wafers 200, and thereafter flows downward and is exhausted from the exhaust tube 231. As described above, the gas flows mainly in the horizontal direction in the processing chamber 201.

A vacuum pump 246 being a vacuum exhaust device is connected to the exhaust tube 231, through a pressure sensor 245 being a pressure detector (pressure detection part) for detecting a pressure in the processing chamber 201, and an APC (Auto Pressure Controller) valve 244 being a pressure adjuster (pressure adjustment part). An exhaust system is mainly constituted of the exhaust tube 231, the APC valve 244, and the pressure sensor 245. It is also acceptable that the vacuum pump 246 is included in the exhaust system. The vacuum pump 246 is configured to perform vacuum-exhaust and stop of vacuum-exhaust of the inside of the processing chamber 201 by opening/closing the valve while operating the vacuum pump 246, and is also configured to adjust the pressure in the processing chamber 201 by adjusting a valve degree while operating the vacuum pump 246. The exhaust system is configured to vacuum-exhaust the inside of the processing chamber 201 so as to be a specific pressure (vacuum degree) by adjusting the opening degree of the APC valve 244 based on pressure information detected by the pressure sensor 245 while operating the vacuum pump 246.

A seal cap 219 as a furnace throat lid member capable of air-tightly closing a lower end opening of the reaction tube 203, is provided in the lower part of the reaction tube 203. The seal cap 219 is configured to abut on the lower end of the reaction tube 203 from a vertical lower side. The seal cap 219 is made of metal such as stainless, etc., and is formed into a disc shape. An O-ring 220 as a seal member abutted on the lower end of the reaction tube 203, is provided on an upper surface of the seal cap 219. A rotation mechanism 267 for rotating a boat 217 as a substrate holding tool described later, is installed on an opposite side of the processing chamber 201 across the seal cap 129. A rotary shaft 255 of the rotation mechanism 267 is passed through the seal cap 219 and is connected to the boat 217. The rotation mechanism 267 is configured to rotate the wafer 200 by rotating the boat 217. The seal cap 219 is configured to be vertically elevated by a boat elevator 115 as an elevation mechanism vertically installed outside of the reaction tube 203. The boat elevator 115 is configured to load and unload the boat 217 into/from the processing chamber 201 by elevating the seal cap 219. Namely, the boat elevator 115 is configured as a transferring device (transferring mechanism) for transferring the boat 217 namely the wafers 200 into/from the processing chamber 201.

The boat 217 as a substrate supporter, is made of a heat-resistant material such as quartz and silicon carbide, etc., and is configured to support a plurality of wafers 200 in a horizontal posture, with centers thereof aligned, so as to be arranged in multiple stages. A heat insulating member 218 made of the heat-resistant material such as quartz and silicon carbide, etc., is provided in a lower part of the boat 217, so that a heat from the heater 207 is hardly transmitted to the seal cap 219 side. The heat-insulating member 218 may also be configured by a plurality of heat-insulating plates made of the heat-resistant material such as quartz and silicon carbide, etc., and a heat-insulating plate holder for supporting these heat-insulting plates in a horizontal posture in multiple stages.

A temperature sensor 263 as a temperature detector, is installed in the reaction tube 203, and by adjusting a power supply state to the heater 207 based on the temperature information detected by the temperature sensor 263, the temperature in the processing chamber 201 is set to have a desired temperature distribution. Similarly to the nozzles 249a and 249b, 249c, the temperature sensor 263 is formed into the L-shape, and is provided along the inner wall of the reaction tube 203.

Figure 16:
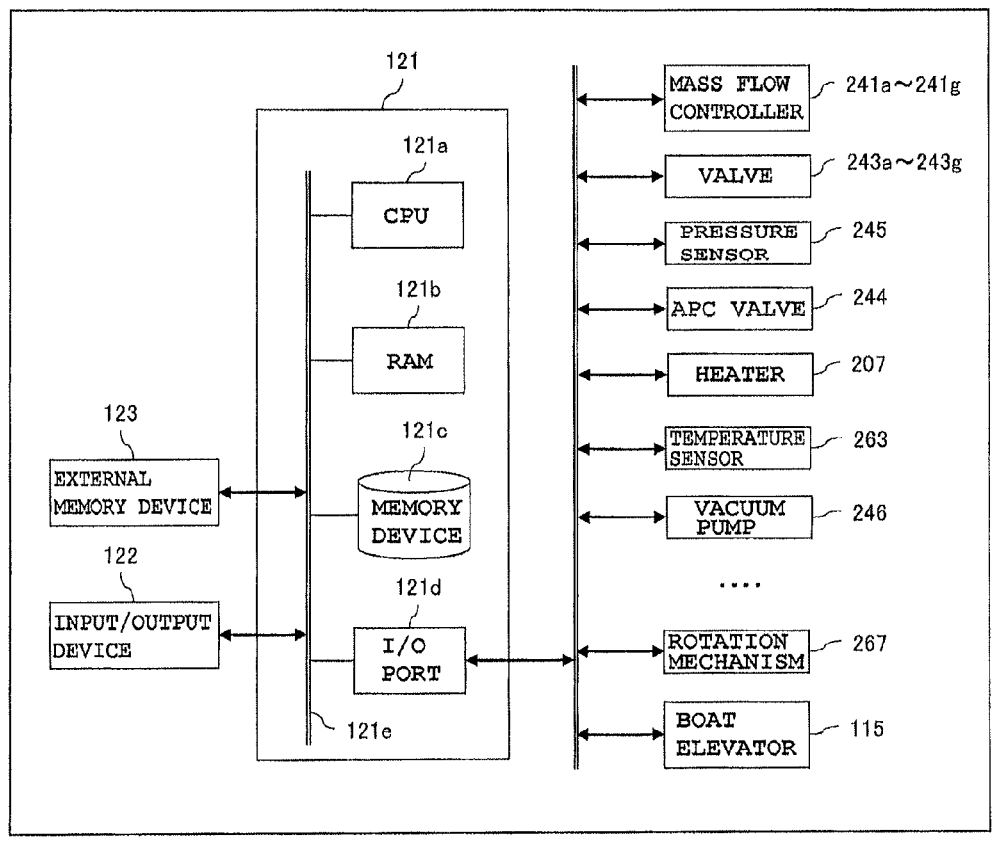
FIG. 16 is a schematic block diagram of a controller of a substrate processing apparatus suitably used in this embodiment.

As shown in FIG. 16, the controller 121 being the control part (control unit), is configured as a computer including CPU (Central Processing Unit) 121a, RAM (Random Access Memory) 121b, a memory device 121c, and I/O port 121d. The RAM 121b, the memory device 121c, and the I/O port 121d are configured to perform data exchange with CPU 121a via an internal bus 121e. An input/output device 122 configured as a touch panel, etc., is connected to the controller 121.

The memory device 121c includes a flash memory, and HDD (Hard Disk Drive), etc., for example. A control program for controlling an operation of the substrate processing apparatus, and a process recipe, etc., indicating a procedure and a condition, etc., of substrate processing as will be described later, are readably stored in the memory device 121c. The process recipe is a combination of recipes, so that each procedure in a substrate processing step described later is executed by the controller 121 to obtain a specific result, and functions as a program. The process recipe and the control program, etc., are generally simply called a program. When using the term of a program in this specification, the program means a case of including the process recipe alone, a case of including a control program alone, or a case including the both cases. The RAM 121b is configured as a memory area (work area) in which the program and data, etc., read by the CPU 121a are temporarily stored.

The I/O port 121d is connected to the above-mentioned mass flow controllers 241a, 241b, 241c, 241d, 241e, 241f, 241g, valves 243a, 243b, 243c, 243d, 243e, 243f, 243g, pressure sensor 245, APC valve 244, vacuum pump 246, heater 207, temperature sensor 263, rotation mechanism 267, and boat elevator 115, etc.

The CPU 121a is configured to read and execute the control program from the memory device 121c, and is configured to read the process recipe from the memory device 121c according to an input, etc., of an operation command from the input/output device 122. Then, the CPU 121a is configured to control a flow rate adjustment operation of each kind of gas by the mass flow controllers 241a, 241b, 241c, 241d, 241e, 241f, 241g, an open/close operation of the valves 243a, 243b, 243c, 243d, 243e, 243g, an open/close operation of the APC valve 244, a pressure adjustment operation based on the pressure sensor 245 by the APC valve 244, a temperature adjustment operation of the heater 207 based on the temperature sensor 263, start/stop of the vacuum pump 246, a rotation speed adjustment operation of the rotation mechanism 267, and an elevating operation of the boat 217 by the boat elevator 115.

The controller 121 may be configured not only as a dedicated computer, but also as a general-purpose computer. For example, an external memory device storing the above-mentioned program (for example, a magnetic tape, a magnetic disc such as a flexible disc and a hard disc, etc., an optical disc such as CD and DVD, etc., an optical magnetic disc such as MO, etc., and a semiconductor memory such as a USB memory and a memory card, etc.) 123, is prepared, and by using the external memory device 123, the program is installed in the general-purpose computer, to thereby constitute the controller 121 according to this embodiment. A unit for supplying the program to the computer, is not limited to a case of supplying it through the recording medium 123. For example, a communication unit such as Internet and a dedicated line, etc., may be used, to thereby supply the program not through the external memory device 123. The memory device 121c and the external memory device 123 are configured as computer-readable recording media. They are also generally simply called recording media. When using the term of the recording media in this specification, the recording media mean a case of including the memory device 121c alone, a case of including the external memory device 123 alone, or a case of including the both cases.

Next, explanation is given for an example of a sequence of forming an insulating film on the substrate as one step of the manufacturing step of a semiconductor device using the processing furnace of the above-mentioned substrate processing apparatus. In the explanation given hereafter, an operation of each part constituting the substrate processing apparatus is controlled by the controller 121.

Explanation is given for a conventional CVD (Chemical Vapor Deposition) method and an ALD (Atomic Layer Deposition) method. For example, in the case of the CVD method, a plurality of kinds of gases containing a plurality of elements constituting a film to be formed, are simultaneously supplied, and in the case of the ALD method, the plurality of kinds of gases containing a plurality of elements constituting the film to be formed, are alternately supplied. Then, a $SiO_2$ film and a $Si_3N_4$ film are formed by controlling supply conditions such as a gas supply flow rate, a gas supply time, and a processing temperature. In these techniques, for example the supply conditions are controlled so that a composition ratio of the film is O/Si≈2 which is a stoichiometric composition when the $SiO_2$ film is formed, and so that the composition ratio of the film is N/Si≈1.33 which is the stoichiometric composition when the $Si_3N_4$ film is formed.

Meanwhile, according to an embodiment of the present invention, the supply conditions are controlled so that the composition ratio of the film to be formed is the stoichiometric composition, or is a specific composition ratio different from the stoichiometric composition. For example, the supply conditions are controlled so that at least one element of the plurality of elements constituting the film to be formed, is more excessive to the stoichiometric composition, than other element. Explanation is given hereafter for a ratio of the plurality of elements constituting the film to be formed, namely an example of the sequence of forming a film while controlling the composition ratio of the film.

In a film formation sequence of this embodiment, a silicon oxycarbonitride film or a silicon oxycarbide film having a specific composition and a specific film thickness, is formed on a wafer 200 by alternately performing:

forming a first layer containing silicon, nitrogen and carbon on the wafer 200 by alternately supplying a chlorosilane-based source and an aminosilane-based source, to the wafer 200 in a processing chamber 201; and forming a silicon oxycarbonitride layer or a silicon oxycarbide layer as a second layer by oxidizing the first layer by supplying an oxygen-containing gas to the wafer 200 in the processing chamber 201.

Here, "by alternately supplying a chlorosilane-based source and an aminosilane-based source, . . . " includes both of the case of performing one set of supplying one of the sources of the chlorosilane-based source and the aminosilane-based source, and thereafter supplying the other source, with this cycle as one set, and the case of repeating this set multiple numbers of times, and means that this set is performed once or more (a specific number of times). The case of performing this set once, corresponds to the first sequence described later, and the case of repeating this set multiple numbers of times, corresponds to the second sequence described later.

Further, "by alternately performing: forming a first layer, and forming a second layer . . . " includes both cases of performing a cycle of forming the first layer and forming the second layer once, with this sequence as one cycle, and repeating this cycle multiple numbers of times, and means that this cycle is performed once or more (the specific number of times).

(First Sequence)

First, the first sequence of this embodiment will be described.

Figure 3:
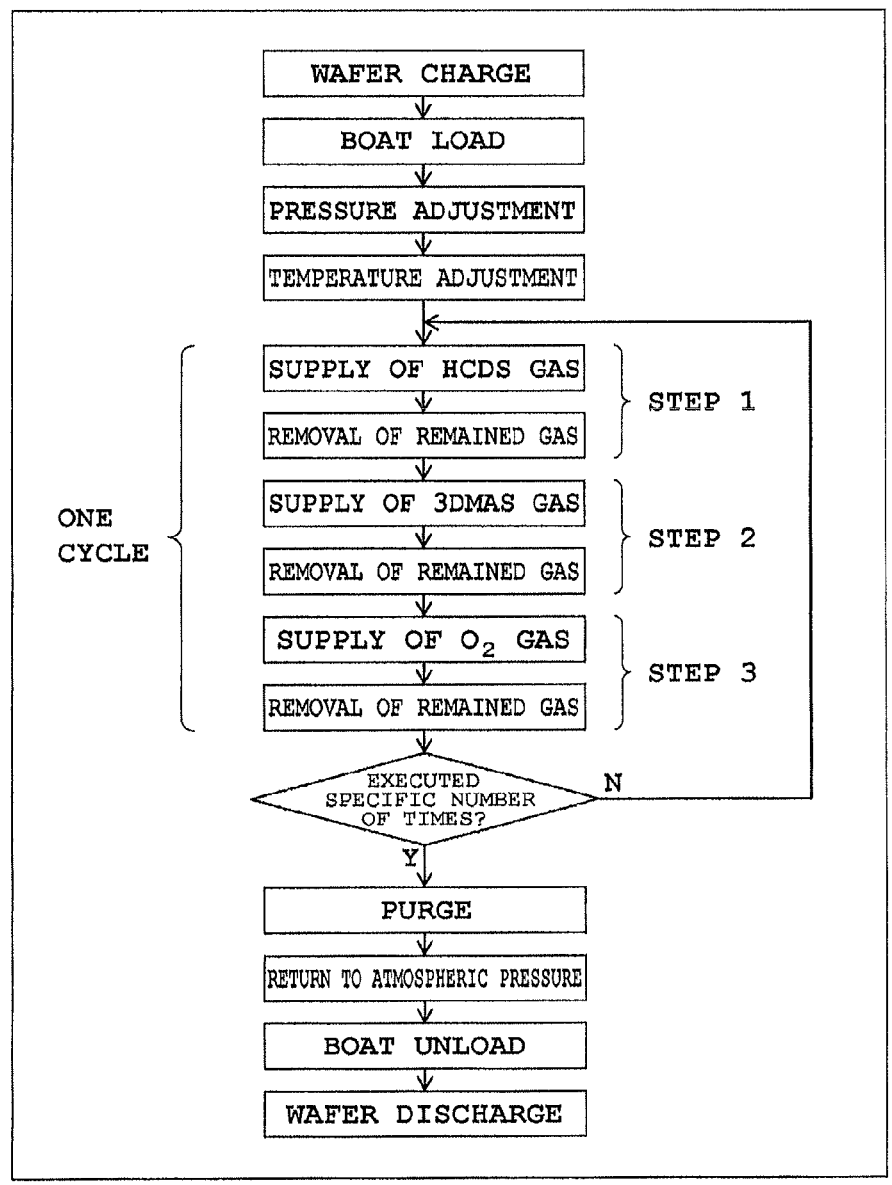
FIG. 3 is a view showing a film formation flow in a first sequence of this embodiment.
Figure 5:
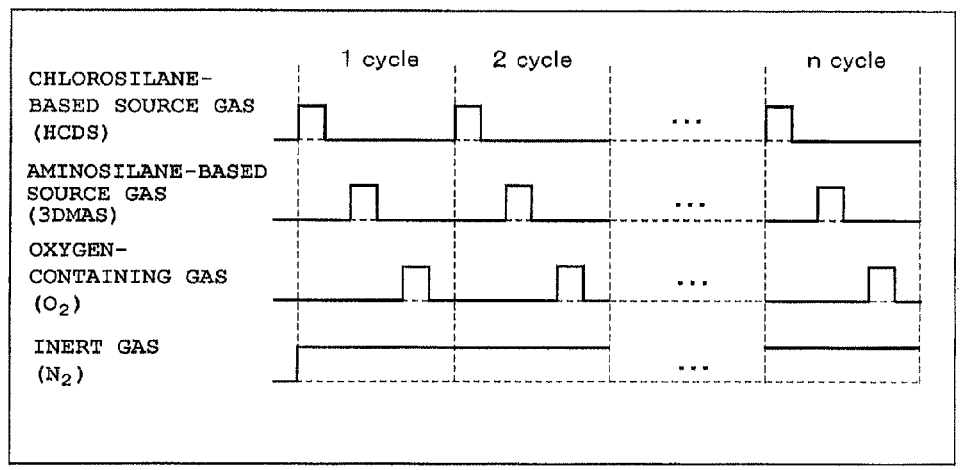
FIG. 5 is a view showing the timing of supplying gas in the first sequence of this embodiment.

FIG. 3 is a view showing a film formation flow in the first sequence of this embodiment. FIG. 5 is a view showing a timing of supplying gas in the first sequence of this embodiment.

In the first sequence of this embodiment, a silicon oxycarbonitride film or a silicon oxycarbide film having a specific composition and a specific film thickness, is formed on a wafer 200 by alternately performing:

forming a first layer containing silicon, nitrogen and carbon on the wafer 200 by supplying one of the sources of a chlorosilane-based source and an aminosilane-based source to the wafer 200 in a processing chamber, and thereafter supplying other source thereto; and forming a silicon oxycarbonitride layer or a silicon oxycarbide layer as a second layer by oxidizing the first layer by supplying an oxygen-containing gas to the wafer 200 in the processing chamber 201.

FIG. 3 and FIG. 5 show an example of supplying the chlorosilane-based source and thereafter supplying the aminosilane-based source to the wafer 200 in the processing chamber 201, namely supplying the chlorosilane-based source prior to the aminosilane-based source.

The first sequence of this embodiment will be specifically described hereafter. Here, explanation is given for an example of forming the silicon oxycarbonitride film (SiOCN film) or the silicon oxycarbide film (SiOC film) on the wafer 200 as the insulating film, based on the film formation flow of FIG. 3, and the sequence of FIG. 5, using the HCDS gas as the chlorosilane-based source gas, and the 3DMAS gas as the aminosilane-based source gas, and the $O_2$ gas as the oxygen-containing gas.

When a plurality of wafers 200 are charged into the boat 217 (wafer charge), as shown in FIG. 1, the boat 217 supporting the plurality of wafers 200, are lifted by the boat elevator 115 and are loaded into the processing chamber 201 (boat load). In this state, the seal cap 219 is set in a state of sealing the lower end of the reaction tube 203 through the O-ring 220.

The inside of the processing chamber 201 is vacuum-exhausted by the vacuum pump 246 so as to be set in a desired pressure (vacuum degree). At this time, the pressure in the processing chamber 201 is measured by the pressure sensor 245, and based on the measured pressure information, the APC valve 244 is feedback-controlled (pressure adjustment). The state of the vacuum pump 246 is always set in an operation state, at least until the processing to the wafer 200 is completed. Further, the inside of the processing chamber 201 is heated by the heater 207 so as to be set at a desired temperature. At this time, the power supply state to the heater 207 is feedback-controlled based on the temperature information detected by the temperature sensor 263 so as to have a desired temperature distribution (temperature adjustment). Heating the inside of the processing chamber 201 by the heater 207, is continuously performed, at least until the processing to the wafer 200 is completed. Subsequently, rotations of the boat 217 and the wafer 200 are started by the rotation mechanism 267. The rotations of the boat 217 and the wafer 200 by the rotation mechanism 267 are continuously performed, at least until the processing to the wafer 200 is completed.

(Step of Forming the Silicon Oxycarbonitride Film or the Silicon Oxycarbide Film)

Thereafter, following three steps, namely, steps 1 to 3 are sequentially executed.

[Step 1]

The valve 243a of the first gas supply tube 232a is opened, to thereby flow the HCDS gas to the first gas supply tube 232a. The HCDS gas flows in the first gas supply tube 232a, with the flow rate adjusted by the mass flow controller 241a. The HCDS gas with the flow rate adjusted, is supplied into the processing chamber 201 from the gas supply holes 250a of the first nozzle 249a, and is exhausted from the exhaust tube 231. At this time, the HCDS gas is supplied to the wafer 200 (supply of the HCDS gas). Simultaneously at this time, the valve 243e is opened, to thereby flow the inert gas such as the $N_2$ gas, etc., into the inert gas supply tube 232e. The $N_2$ gas flows into the inert gas supply tube 232e, with the flow rate adjusted by the mass flow controller 241e. The $N_2$ gas with the flow rate adjusted, is supplied into the processing chamber 201 together with the HCDS gas, and is exhausted from the exhaust tube 231. At this time, in order to prevent the invasion of the HCDS gas into the second nozzle 249b and the third nozzle 249c, the valves 243f, 243g are opened, to thereby flow the $N_2$ gas into the second inert gas supply tube 232f and the third inert gas supply tube 232g. The $N_2$ gas is supplied into the processing chamber 201 through the second nozzle 249b, the third gas supply tube 232c, the second nozzle 249b, and the third nozzle 249c, and is exhausted from the exhaust tube 231.

At this time, the APC valve 244 is properly adjusted, to thereby set the pressure in the processing chamber 201 to the pressure in the range of 1 to 13300 Pa and preferably set to the pressure in the range of 20 to 1330 Pa for example. The supply flow rate of the HCDS gas controlled by the mass flow controller 241a is set to the supply flow rate in the range of 1 to 1000 sccm for example. The supply flow rate of the $N_2$ gas controlled by the mass flow controllers 241e, 241f, 241g is set to the supply flow rate in the range of 100 to 10000 sccm for example. The time for supplying the HCDS gas to the wafer 200, namely a gas supply time (irradiation time) is set to the time in the range of 1 to 120 seconds, and preferably 1 to 60 seconds for example. The temperature of the heater 207 at this time is set so that the temperature of the wafer 200 is set to the temperature for example in the range of 250 to 700° C., preferably 350 to 650° C., and more preferably 350 to 600° C. When the temperature of the wafer 200 is less than 250° C., the HCDS is hardly chemically adsorbed on the wafer 200, and a practical film formation rate cannot be obtained in some cases. This can be solved by setting the temperature of the wafer 200 to 250° C. or more. Also, by setting the temperature of the wafer 200 to 350° C. or more, the HCDS can be more sufficiently adsorbed on the wafer 200, and a more sufficient film formation rate can be obtained. Further, when the temperature of the wafer 200 exceeds 700° C., the CVD reaction occurs strongly (a vapor phase reaction is dominant), to thereby easily deteriorate the uniformity of the film thickness, and control of the film thickness becomes difficult. By setting the temperature of the wafer 200 to 700° C. or less, the deterioration of the uniformity of the film thickness can be suppressed, and the control of the film thickness can be achieved. Particularly, by setting the temperature of the wafer 200 to 650° C. or less, or further 600° C. or less, a surface reaction becomes dominant, thus easily securing the uniformity of the film thickness and easily facilitating the control of the film thickness. Therefore the temperature of the wafer 200 is set to the temperature in the range of 250 to 700° C., preferably 300 to 650° C., and further preferably 350 to 600° C.

By supplying the HCDS gas, a silicon-containing layer having a thickness of less than one atomic layer to about several atomic layers for example, is formed on the wafer 200 (underlayer on the surface). The silicon-containing layer may be an adsorption layer of the HCDS gas, or may be a silicon layer (Si layer) containing Cl, or may include both layers. Wherein, the silicon-containing layer is preferably a layer containing silicon (Si) and chlorine (Cl). Here, the silicon layer is a general name including a continuous layer made of silicon (Si), a discontinuous layer, and a silicon thin film formed by overlap of these layers. The continuous layer made of Si is also called a silicon thin film in some cases. Si constituting the silicon layer also includes a case that a bond between Si and Cl is not completely cut. Further, the adsorption layer of the HCDS gas also includes a continuous chemical adsorption layer, and a discontinuous chemical adsorption layer, of gas molecules of the HCDS gas. Namely, the adsorption layer of the HCDS gas includes a chemical adsorption layer of one molecular layer or less than one molecular layer composed of HCDS molecules. The HCDS ($Si_2Cl_6$) molecules constituting the adsorption layer of the HCDS gas include a case that the bond between Si and Cl is partially cut ($Si_xCl_y$ molecule). Namely, the adsorption layer of the HCDS gas includes a continuous chemical adsorption layer and a discontinuous chemical adsorption layer of $Si_2Cl_6$ molecules and/or $Si_xCl_y$ molecules. The layer having the thickness of less than one atomic layer means an atomic layer formed discontinuously, and the layer having the thickness of one atomic layer means an atomic layer formed continuously. Further, the layer having the thickness of less than one molecular layer means a molecular layer formed discontinuously, and the layer having the thickness of one molecular layer means a molecular layer formed continuously. The silicon layer is formed by deposition of Si on the wafer 200 under a condition that the HCDS gas is self-decomposed (thermally decomposed), namely under a condition that a thermal decomposition reaction of HCDS is generated. The adsorption layer of the HCDS gas is formed by adsorption of the HCDS gas on the wafer 200 under a condition that the HCDS gas is not self-decomposed (thermally decomposed), namely under a condition that the thermal decomposition reaction of HCDS is not generated. Preferably, the film formation rate can be higher in a case of forming the silicon layer on the wafer 200, than a case of forming the adsorption layer of the HCDS gas on the wafer 200. When the thickness of the silicon-containing layer formed on the wafer 200 exceeds several atomic layers, a modifying action in step 2 and step 3 described later, does not reach the whole body of the silicon-containing layer. Further, a minimum value of the silicon-containing layer that can be formed on the wafer 200, is less than one atomic layer. Therefore, the thickness of the silicon-containing layer is preferably set to the thickness in the range of about less than one atomic layer to several atomic layers. By setting the thickness of the silicon-containing layer to one atomic layer or less, namely, to one atomic layer or less than one atomic layer, an action of the modifying reaction in step 2 and step 3 described layer can be relatively increased, and the time required for the modifying reaction in step 2 and step 3, can be shortened. Also, the time required for forming the silicon-containing layer in step 1, can also be shortened. As a result, a processing time per one cycle can be shortened, and the processing time in total can be shortened. Namely, the film formation rate can also be increased. Further, by setting the thickness of the silicon-containing layer to one atomic layer or less, controllability of the uniformity of the film thickness can also be improved.

After the silicon-containing layer is formed, the valve 243a of the first gas supply tube 232a is closed, to thereby stop the supply of the HCDS gas. At this time, the APC valve 244 of the exhaust tube 231 is left opened, to thereby vacuum-exhaust the inside of the processing chamber 201 by the vacuum pump 246, and remove the unreacted HCDS gas or the HCDS gas after contributing to the formation of the first layer remained in the processing chamber 201, from the processing chamber 201 (removal of the remained gas). At this time, the valves 243e, 243f, 243g are left opened, to thereby keep the supply of the $N_2$ gas into the processing chamber 201 as the inert gas. The $N_2$ gas functions as a purge gas, thus making it possible to increase the effect of removing the unreacted HCDS gas remained in the processing chamber 201 or the HCDS gas after contributing to the formation of the first layer, from the processing chamber 201. At this time, the gas remained in the processing chamber 201 may not be completely removed, and the inside of the processing chamber 201 may not be completely purged. If the gas remained in the processing chamber 201 is a small amount, there is no adverse influence generated in step 2 performed thereafter. At this time, the flow rate of the $N_2$ gas supplied into the processing chamber 201 is not required to be a large flow rate, and for example, by supplying about the same amount of the $N_2$ gas as the volume of the reaction tube 203 (processing chamber 201), purge of not generating the adverse influence in step 2 can be performed. Thus, by not completely purging the inside of the processing chamber 201, a purging time can be shortened, and the throughput can be improved. Further, consumption of the $N_2$ gas can be suppressed to a necessary minimum.

As the chlorosilane-based source gas, not only a hexachlorodisilane ($Si_2Cl_6$, abbreviated as HCDS) gas, but also inorganic sources such as a tetrachlorosilane namely silicon tetrachloride ($SiCl_4$, abbreviated as STC) gas, a trichlorosilane ($SiHCl_3$, abbreviated as TCS) gas, a dichlorosilane ($SiH_2Cl_2$, abbreviated as DCS) gas, and a monochlorosilane ($SiH_3Cl$, abbreviated as MCS) gas, etc., may be used. As the inert gas, rare gases such as Ar gas, He gas, Ne gas, and Xe gas, etc., may be used other than the $N_2$ gas.

[Step 2]

After the remained gas in the processing chamber 201 is removed after end of step 1, the valve 243b of the second gas supply tuber 232b is opened, to thereby flow the 3DMAS gas into the second gas supply tube 232b. The flow rate of the 3DMAS gas flowing into the second gas supply tube 232b is adjusted by the mass flow controller 241b. The 3DMAS gas with the flow rate adjusted, is supplied into the processing chamber 201 from the gas supply holes 250b of the second nozzle 249b, and is exhausted from the exhaust tube 231. At this time, the 3DMAS gas is supplied to the wafers 200 (supply of the 3DMAS gas). Simultaneously at this time, the valve 243f is opened, to thereby flow the $N_2$ gas into the second inert gas supply tube 232f as the inert gas. The flow rate of the $N_2$ gas flowing into the second inert gas supply tube 232f is adjusted by the mass flow controller 241f. The $N_2$ gas with the flow rate adjusted, is supplied into the processing chamber 201 together with the 3DMAS gas, and is exhausted from the exhaust tube 231. At this time, in order to prevent the invasion of the 3DMAS gas into the first nozzle 249a and the third nozzle 249c, the valves 243e, 243g are opened, to thereby flow the $N_2$ gas into the first inert gas supply tube 232e and the third inert gas supply tube 232g. The $N_2$ gas is supplied into the processing chamber 201 through the first gas supply tube 232a, the third gas supply tube 232c, the first nozzle 249a, and the third nozzle 249c, and is exhausted from the exhaust tube 231.

At this time, the APC valve 244 is properly adjusted, to thereby set the pressure in the processing chamber 201 to the pressure in the range of 1 to 13300 Pa, and preferably 20 to 1330 Pa for example. The supply flow rate of the 3DMAS gas controlled by the mass flow controller 241b is set to the supply flow rate in the range of 1 to 1000 sccm for example. The supply flow rate of the $N_2$ gas controlled by the mass flow controller 241F is set to the supply flow rate in the range of 100 to 10000 sccm for example. The time for supplying the 3DMAS gas to the wafers 200, namely the gas supply time (irradiation time) is set to the time in the range of 1 to 120 seconds, and preferably 1 to 60 seconds for example. Similarly to step 1, the temperature of the heater 207 at this time, is set so that the temperature of the wafer 200 is set in the range of 250 to 700° C., preferably 350 to 650° C., and more preferably 350 to 600° C. for example.

By supplying the 3DMAS gas, reaction is caused between the silicon-containing layer formed on the wafer 200 in step 1, and the 3DMAS GAS. Thus, the silicon-containing layer is changed (modified) to the first layer containing silicon (Si), nitrogen (N), and carbon (C). The first layer is the layer containing Si, N, and C having the thickness of less than one atomic layer to about several atomic layers. The first layer is the layer with a relatively large ratio of Si-component and C-component, and namely is a Si-rich layer and a C-rich layer.

Thereafter, the valve 243b of the second gas supply tube 232b is closed, to thereby stop the supply of the 3DMAS gas. At this time, the APC valve 244 of the exhaust tube 231 is left opened, to thereby vacuum-exhaust the inside of the processing chamber 201 by the vacuum pump 246, and remove the unreacted 3DMAS gas or the 3DMAS gas after contributing to the reaction, or the reaction byproduct remained in the processing chamber 201, from the processing chamber 201 (removal of the remained gas). At this time, the valves 243f, 243e, 243g are left opened, to thereby keep the supply of the $N_2$ gas into the processing chamber 201 as the inert gas. The $N_2$ gas functions as the purge gas, thus improving the effect of removing the unreacted 3DMAS gas or the 3DMAS gas after contributing to the formation of the first layer or the reaction byproduct remained in the processing chamber 201, from the processing chamber 201. At this time, the gas remained in the processing chamber 201 is not required to be completely removed, and the inside of the processing chamber 201 is not required to be completely purged. If the gas remained in the processing chamber 201 is a small amount, there is no adverse influence generated in step 3 performed thereafter. At this time, the flow rate of the $N_2$ gas supplied into the processing chamber 201 is not required to be a large flow rate, and for example, by supplying about the same amount of the $N_2$ gas as the volume of the reaction tube 203 (processing chamber 201), purge of not generating the adverse influence in step 3 can be performed. Thus, by not completely purging the inside of the processing chamber 201, a purging time can be shortened, and the throughput can be improved. Further, consumption of the $N_2$ gas can be suppressed to a necessary minimum.

As the aminosilane-based source gas, the organic source such as tetrakisdimethylaminosilane ($Si[N(CH_3)_2]_4$, abbreviated as 4DMAS) gas, bisdiethylaminosilane ($Si[N(C_2H_5)_2]_2H_2$, abbreviated as 2DEAS) gas, bistertiarybutylaminosilane ($SiH_2[NHH(C_4H_9)]_2$, abbreviated as BTBAS) gas, etc., may be used. As the inert gas, rare gases such as Ar gas, He gas, Ne gas, and Xe gas, etc., may be used other than the $N_2$ gas.

[Step 3]

After the remained gas in the processing chamber 201 is removed after end of step 2, the valve 243c of the third gas supply tuber 232c is opened, to thereby flow the $O_2$ gas into the third gas supply tube 232c. The flow rate of the $O_2$ gas flowing into the third gas supply tube 232c is adjusted by the mass flow controller 241c. The $O_2$ gas with the flow rate adjusted, is supplied into the processing chamber 201 from the gas supply holes 250c of the third nozzle 249c. The $O_2$ gas supplied into the processing chamber 201 is thermally activated and is exhausted from the exhaust tube 231. At this time, the thermally activated $O_2$ gas is supplied to the wafers 200 (supply of the $O_2$ gas). Simultaneously at this time, the valve 243g is opened, to thereby flow the $N_2$ gas into the third inert gas supply tube 232g. The $N_2$ gas is supplied into the processing chamber 201 together with the $O_2$ gas, and is exhausted from the exhaust tube 231. At this time, in order to prevent the invasion of the $O_2$ gas into the first nozzle 249a and the second nozzle 249b, the valves 243e, 243f are opened, to thereby flow the $N_2$ gas into the first inert gas supply tube 232e and the second inert gas supply tube 232f. The $N_2$ gas is supplied into the processing chamber 201 through the first gas supply tube 232a, the second gas supply tube 232b, the first nozzle 249a, and the second nozzle 249b, and is exhausted from the exhaust tube 231.

At this time, the APC valve 244 is properly adjusted, to thereby set the pressure in the processing chamber 201 to the pressure in the range of 1 to 13300 Pa for example. By setting the pressure in the processing chamber 201 in such a relatively high pressure zone, the $O_2$ gas can be thermally activated by non-plasma. By thermally activating and supplying the $O_2$ gas, a soft reaction can be caused, and oxidation described later can be softly performed. The supply flow rate of the $O_2$ gas controlled by the mass flow controller 241c is set to the flow rate in the range of 100 to 10000 sccm for example. The supply flow rate of the $N_2$ gas controlled by the mass flow controllers 241g, 241e, 241f is set to the flow rate in the range of 100 to 10000 sccm for example. At this time, the partial pressure of the $O_2$ gas in the processing chamber 201 is set to the partial pressure in the range of 0.01 to 2970 Pa. The time for supplying the $O_2$ gas to the wafers 200, namely the gas supply time (irradiation time) is set to the time in the range of 1 to 120 seconds, and preferably 1 to 60 seconds for example. Similarly to steps 1 to 2, the temperature of the heater 207 at this time, is set so that the temperature of the wafer 200 is set in the range of 250 to 700° C., preferably 350 to 650° C., and more preferably 350 to 600° C. for example.

The gas flowed into the processing chamber 201, is the $O_2$ gas thermally activated by increasing the pressure in the processing chamber 201, and neither the HCDS gas nor the 3DMAS gas is flowed into the processing chamber 201. Accordingly, a vapor phase reaction is not caused by the $O_2$ gas, and the activated $O_2$ gas causes a reaction with at least a part of the first layer containing Si, N, and C, formed on the wafer 200 in step 2. Thus, the first layer is oxidized, and is modified to the silicon oxycarbonitride layer (SiOCN layer) or the silicon oxycarbide layer (SiOC layer) as the second layer.

By thermally activating and supplying the $O_2$ gas into the processing chamber 201, the first layer is thermally oxidized and can be modified (changed) to the SiOCN layer or the SiOC layer. At this time, the first layer can be modified to the SiOCN layer or the SiOC layer while adding O-component to the first layer. Also, at this time, by an action of a thermal oxidation by the $O_2$ gas, Si—O bond in the first layer is increased, and meanwhile Si—N bond, Si—C bond, and Si—Si bond are reduced, thus reducing the ratio of the N-component, the ratio of the C-component, and the ratio of the Si-component in the first layer. Then, at this time, by extending a thermal oxidation time, or increasing an oxidation power in the thermal oxidation, a major portion of the N-component is desorbed, to thereby, reduce the N-component to an impurity level, or the N-component can substantially disappear. Namely, the first layer can be modified to the SiOCN layer or the SiOC layer while changing the composition ratio in a direction of increasing the oxygen concentration, and in a direction of reducing the nitrogen concentration, the carbon concentration, and the silicon concentration. Further, at this time, by controlling the pressure in the processing chamber 201 and the processing conditions such as gas supply time, etc., the ratio of the O-component in the SiOCN layer or the SiOC layer, namely the oxygen concentration can be finely adjusted, and the composition ratio of the SiOCN layer or the SiOC layer can be more minutely controlled.

It is found that the C-component in the first layer formed in steps 1 and 2, is in a rich state compared with the N-component. For example, in a certain experiment, the carbon concentration is twice or more the nitrogen concentration in some cases. Namely, by the action of the thermal oxidation, the C-component and the N-component are remained in the first layer by stopping the oxidation before the N-component in the first layer is completely desorbed, namely while allowing the N-component to be remained, and the first layer is modified to the SiOCN layer. Further, even in a stage when desorption of a major portion of the N-component in the first layer is ended by the action of the thermal oxidation by the $O_2$ gas, the C-component is remained in the first layer, and by stopping the oxidation in this state, the first layer is modified to the SiOC layer. If a high oxidizing power can be obtained like a third sequence described later, the first layer is modified to the SiO layer by continuing the oxidation even after end of the desorption of the major portion of the N-component, and stopping the oxidation in the stage when the desorption of the major portion of the C-component is ended. Namely, by controlling a gas supply time (oxidation processing time) or the oxidizing power, the ratio of the C-component, namely the carbon concentration can be controlled and any one of the SiOCN layer, SiOC layer, and SiO layer can be formed while controlling the composition ratio. Further, at this time, by controlling the processing conditions such as the pressure in the processing chamber 201 and the gas supply time, etc., the ratio of the O-component in the SiOCN layer, SiOC layer, or SiO layer, namely the oxygen concentration can be finely adjusted, and the composition ratio of the SiOCN layer, SiOC layer, or SiO layer can be more minutely controlled.

At this time, the oxidation reaction of the first layer is preferably not saturated. For example, when the one atomic layer or the first layer having the thickness of less than one atomic layer, is formed in steps 1 and 2, a part of the first layer is preferably oxidized. In this case, the oxidation is carried out under a condition that the oxidation reaction of the first layer is unsaturated, so that the whole body of the one atomic layer or the first layer having the thickness of less than one atomic layer is not oxidized.

In order to make the oxidation reaction of the first layer unsaturated, the processing conditions of step 3 may be used as the above-mentioned processing conditions. Further, by using the following processing conditions as the processing conditions in step 3, the oxidation reaction of the first layer is easily unsaturated.

Wafer temperature: 500 to 600° C.
Pressure in the processing chamber: 133 to 2666 Pa
$O_2$ gas partial pressure: 33 to 2515 Pa
$O_2$ gas supply flow rate: 1000 to 5000 sccm
$N_2$ gas supply flow rate: 300 to 3000 sccm
$O_2$ gas supply time: 6 to 60 seconds Thereafter, the valve 243c of the third gas supply tube 232c is closed, to thereby stop the supply of the $O_2$ gas. At this time, the APC valve 244 of the exhaust tube 231 is left opened, to thereby vacuum-exhaust the inside of the processing chamber 201 by the vacuum pump 246, and remove the unreacted O2 gas or the O2 gas after contributing to the reaction, or the reaction byproduct remained in the processing chamber 201, from the processing chamber 201. At this time, the valves 243g, 243e, 243f are left opened, to thereby keep the supply of the $N_2$ gas into the processing chamber 201 as the inert gas. The $N_2$ gas functions as the purge gas, thus improving the effect of removing the unreacted O2 gas or the O2 gas after contributing to the formation of the second layer or the reaction byproduct remained in the processing chamber 201, from the processing chamber 201. At this time, the gas remained in the processing chamber 201 may not be completely removed, and the inside of the processing chamber 201 may not be completely purged. If the gas remained in the processing chamber 201 is a small amount, there is no adverse influence generated in step 1 performed thereafter. At this time, the flow rate of the $N_2$ gas supplied into the processing chamber 201 is not required to be a large flow rate, and for example, by supplying about the same amount of the $N_2$ gas as the volume of the reaction tube 203 (processing chamber 201), purge of not generating the adverse influence in step 1 can be performed. Thus, by not completely purging the inside of the processing chamber 201, a purging time can be shortened, and the throughput can be improved. Further, consumption of the $N_2$ gas can be suppressed to a necessary minimum.

As the oxygen-containing gas, nitrous oxide ($N_2O$) gas, nitrogen monoxide (NO) gas, nitrogen dioxide ($NO_2$) gas, ozone ($O_3$) gas, hydrogen ($H_2$) gas+oxygen ($O_2$) gas, $H_2$ gas+$O_3$ gas, steam ($H_2O$) gas, carbon monoxide (CO) gas, and carbon dioxide ($CO_2$) gas may be used, in addition to the $O_2$ gas. As the inert gas, rare gases such as Ar gas, He gas, Ne gas, and Xe gas, etc., may be used other than the $N_2$ gas.

The silicon oxycarbonitride film (SiOCN film) or the silicon oxycarbide film (SiOC film) having the specific composition and the specific film thickness, can be formed on the wafer 200, by performing once or more (the specific number of times) the cycle of the above-mentioned steps 1 to 3, with these steps as one cycle. The above-mentioned cycle is preferably repeated multiple numbers of times. Namely, by making the thickness of the SiOCN layer or the SiOC layer formed per one cycle smaller than a desired film thickness, the cycle is preferably repeated multiple numbers of times until the desired film thickness is obtained.

When the processing of forming the SiOCN film or the SiOC film having the specific composition and the specific thickness is performed, the valves 243e, 243f, 243g are opened, and the $N_2$ gas as the inert gas is supplied into the processing chamber 201 from each of the first inert gas supply tube 232e, the second inert gas supply tube 232f, and the third inert gas supply tube 232g, and is exhausted from the exhaust tube 231. The N$_2$ gas functions as the purge gas, thus purging the inside of the processing chamber 201 by the inert gas, and removing (purge) the gas or the reaction byproduct remained in the processing chamber 201 from the processing chamber 201. Thereafter, the atmosphere in the processing chamber is replaced with the inert gas (replacement with the inert gas), and the pressure in the processing chamber 201 is returned to a normal pressure (return to atmospheric pressure).

Thereafter, the seal cap 219 is descended by the boat elevator 115, and the lower end of the reaction tube 203 is opened, so that the processed wafer 200 is unloaded to outside of the reaction tube 203 from the lower end of the reaction tube 203 in a state of being supported by the boat 217 (boat unload). Thereafter, the processed wafer 200 is discharged from the boat 217 (wafer discharge).

(Second Sequence)

Next, the second sequence of this embodiment will be described.

Figure 4:
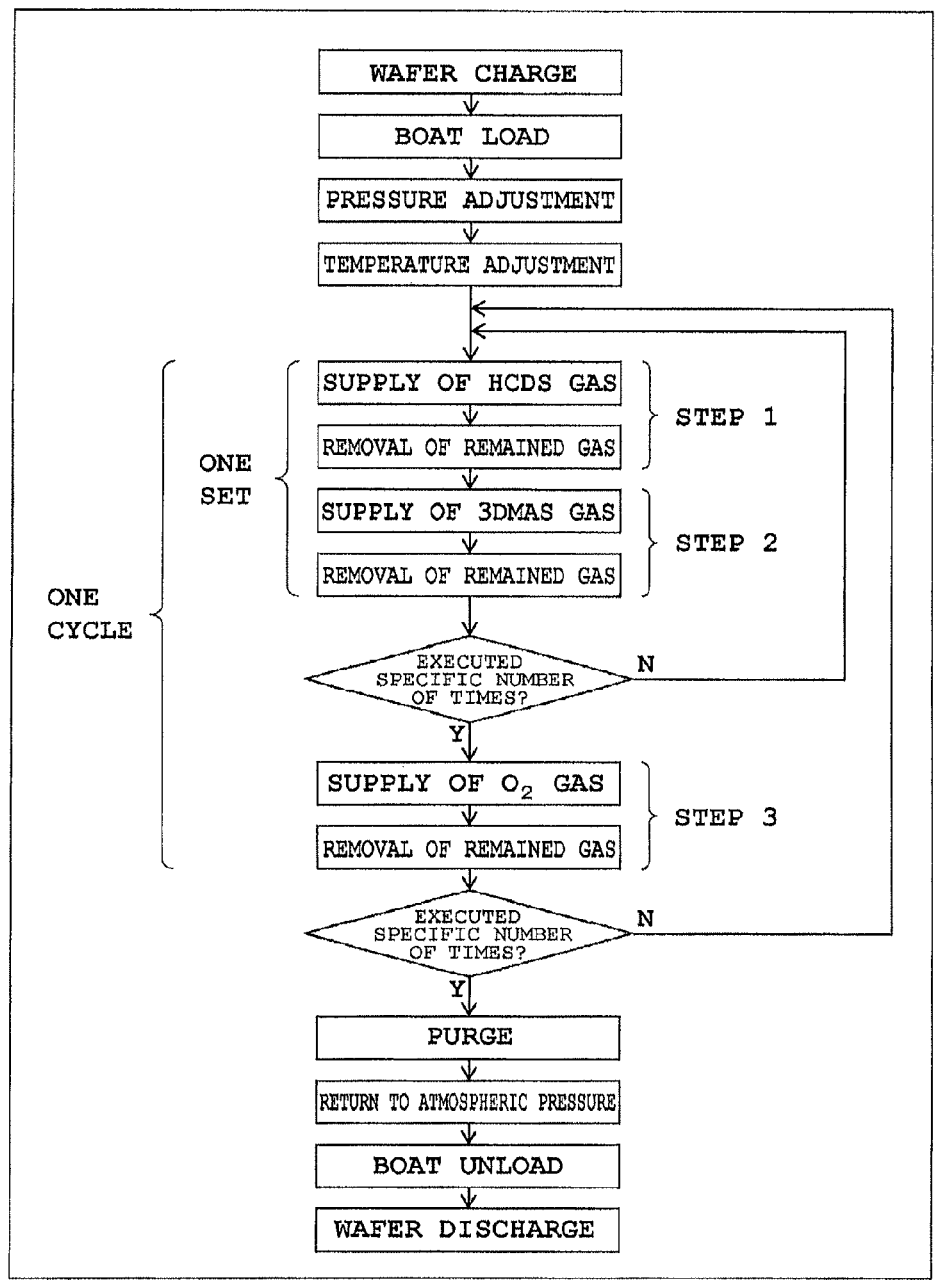
FIG. 4 is a view showing the film formation flow in a second sequence of this embodiment.
Figure 6:
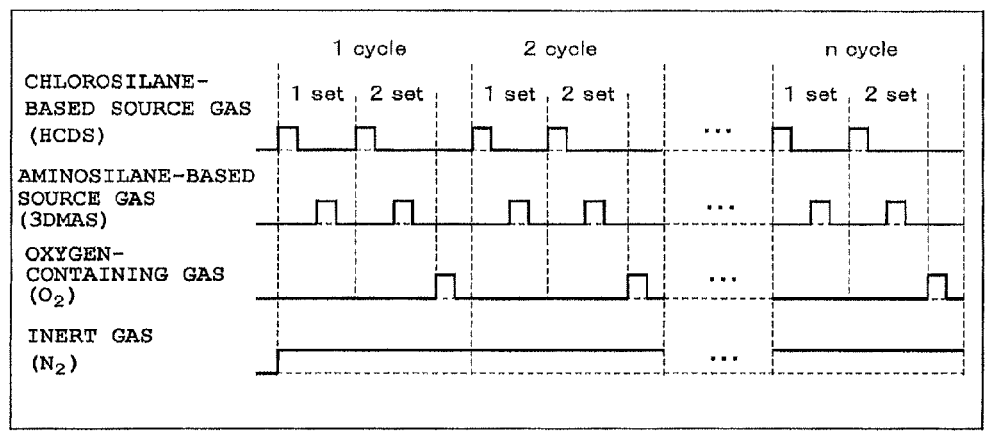
FIG. 6 is a view showing the timing of supplying gas in the second sequence of this embodiment.

The SiOCN film or the SiOC film can be formed by using the above-mentioned first sequence, when the O$_2$ gas for example is used as the oxygen-containing gas, or when the film formation is performed in the low temperature zone, for example in the temperature zone of 55° C. or less. Meanwhile, the SiOCN film or the SiOC film may also be formed using the second sequence described below, when a gas having a stronger oxidizing power than the O$_2$ gas is used as the oxygen-containing gas, or when the film formation is performed in a relatively high temperature zone. FIG. 4 is a view showing a film formation flow of the second sequence according to this embodiment. FIG. 6 is a view showing the timing of supplying gas in the second sequence of this embodiment.

In the second sequence of this embodiment, a silicon oxycarbonitride film or a silicon oxycarbide film having a specific composition and a specific film thickness, is formed on a wafer 200 by alternately performing:

forming a first layer containing silicon, nitrogen and carbon on the wafer 200 by supplying one of the sources of a chlorosilane-based source and an aminosilane-based source to the wafer 200 in a processing chamber 201, and thereafter supplying the other source thereto, and alternately repeating this cycle multiple numbers of times; and forming a silicon oxycarbonitride layer or a silicon oxycarbide layer as a second layer by oxidizing the first layer by supplying an oxygen-containing gas to the wafer 200 in the processing chamber 201.

FIG. 4 and FIG. 6 show an example of supplying the chlorosilane-based source to the wafer 200 in the processing chamber 201, and thereafter supplying the aminosilane-based source thereto, and alternately repeating this sequence, namely, an example of supplying the chlorosilane-based source prior to the aminosilane-based source, when the first layer is formed.

Namely, in this sequence, the silicon oxycarbonitride film (SiOCN film) or the silicon oxycarbide film (SiOC film) is formed on the wafer 200 as the insulating film, by repeating multiple numbers of times the steps 1 and 2 of the above-mentioned first sequence as one set, and thereafter performing step 3, with this sequence as one cycle, and performing this cycle the specific number of times. FIG. 6 shows an example of forming the SiOCN film or the SiOC film having the specific film thickness on the wafer 200, by performing twice the above-mentioned steps 1 and 2 as one set, and thereafter performing step 3, with this sequence as one cycle, and performing this cycle n-numbers of times. This sequence is different from the first sequence only in a point that a set of steps 1, 2 is repeated multiple numbers of times, with these steps as one set, and thereafter step 3 is performed, and the other point can be performed similarly to the first sequence. Further, similar processing conditions as the above-mentioned first sequence can be used as the processing conditions of this sequence.

Thus, the ratio of the silicon-component, the carbon-component and the nitrogen component can be properly controlled (in a rich direction), and controllability of the composition ratio of the SiOCN film or the SiOC film can be further improved, by repeating multiple numbers of times steps 1 and 2 as one set, and thereafter performing step 3, with this sequence as one cycle, and performing this cycle the specific number of times. Further, by increasing the number of sets, the number of layers of the first layer formed per one cycle, can be increased by the number of sets, and a cycle rate can be improved. Thus, the film formation rate can also be improved.

(Third Sequence)

Next, a third sequence of this embodiment will be described.

Figure 7:
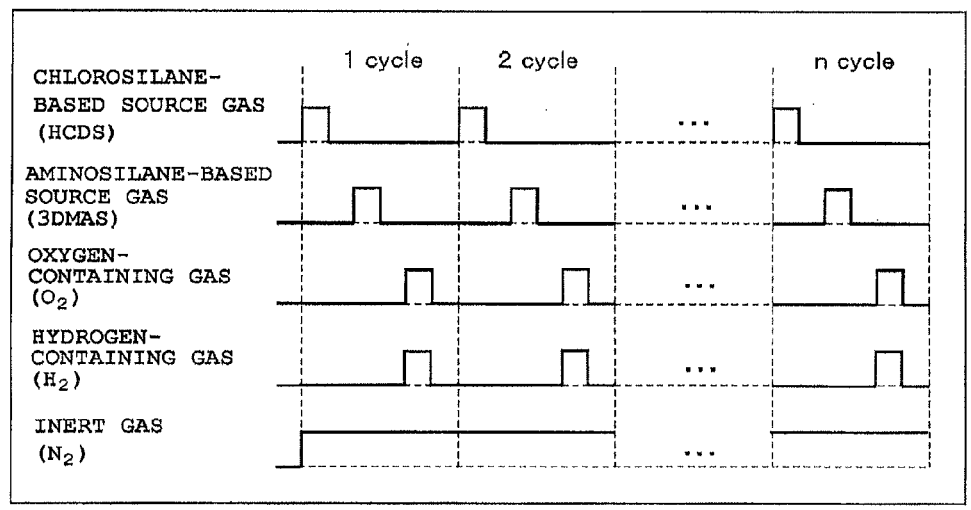
FIG. 7 is a view showing the timing of supplying gas in a third sequence of this embodiment.

In the above-mentioned first sequence, explanation is given for the example of thermally oxidizing the first layer using the oxygen-containing gas in step 3. However, the first layer may be thermally oxidized using the oxygen-containing gas and the hydrogen-containing gas in step 3, as shown in the third sequence described below. FIG. 7 is a view showing the timing of supplying gas in the third sequence of this embodiment.

In the third sequence of this embodiment, a silicon oxycarbonitride film or a silicon oxide film having a specific composition and a specific film thickness, is formed on a wafer 200 by alternately performing:

forming a first layer containing silicon, nitrogen and carbon on the wafer 200 by supplying one of the sources of a chlorosilane-based source and an aminosilane-based source to the wafer 200 in a processing chamber 201, and thereafter supplying the other source thereto; and forming a silicon oxycarbonitride layer or a silicon oxide layer as a second layer by oxidizing the first layer by supplying an oxygen-containing gas and a hydrogen-containing gas to the wafer 200 in the processing chamber 201 under depressurization.

FIG. 7 shows an example of supplying the chlorosilane-based source to the wafer 200 in the processing chamber 201 and thereafter supplying the aminosilane-based source thereto, namely, an example of supplying the chlorosilane-based source prior to the aminosilane-based source, when the first layer is formed.

Namely, in this sequence, the hydrogen-containing gas is supplied together with the oxygen-containing gas, in step 3 of the above-mentioned first sequence. This sequence is different from the first sequence only in this point, and the other point can be performed similarly to the first sequence. In this sequence, when the O$_2$ gas is flowed into the third gas supply tube 232c by opening the valve 243c of the third gas supply tube 232c, the valve 243d of the fourth gas supply tube 232d is further opened, and the H$_2$ gas is flowed into the fourth gas supply tube 232d, to thereby supply the thermally activated O$_2$ gas and the H$_2$ gas together to the wafer 200 heated in the processing chamber 201 under depressurization. The flow rate of the H$_2$ gas flowed into the fourth gas supply tube 232d, is adjusted by the mass flow controller 241d. The supply flow rate of the H$_2$ gas controlled by the mass flow controller 241d in step 3 of this sequence, is set to the flow rate in the range of 100 to 5000 sccm for example. The processing conditions similar to those of the above-mentioned first sequence can be used as the other processing conditions in this sequence.

Thus, by supplying the hydrogen-containing gas to the wafer 200 heated in the processing chamber 201 under depressurization of less than atmospheric pressure together with the oxygen-containing gas, the oxygen-containing gas and the hydrogen-containing gas are reacted each other in the processing chamber 201, and oxidation species not containing water component ($H_2O$) containing oxygen such as atomic oxygen (O), etc., is generated, to thereby oxidize the first layer by the oxidation species. In this case, oxidation can be carried out with higher oxidizing power than a case of oxidizing the first layer using the oxygen-containing gas alone, or a case of oxidizing the first layer using steam ($H_2O$). At this time, the first layer can be modified to the SiO layer by making both components of C-component and N-component in the first layer desorbed from each other by energy of the oxidation species while adding the O-component to the first layer. Also, at this time, Si—N bond, Si—C bond and Si—Si bond are reduced, while Si—O bond is increased in the first layer, and the ratio of the N-component, the ratio of the C-component, and the ratio of the Si-component in the first layer are reduced. Particularly, major portions of the N-component and the C-component are reduced to the impurity level or substantially disappear by desorption of the major portions thereof. Namely, the first layer can be modified to the SiO layer while changing the composition ratio in a direction of increasing the oxygen concentration, and in a direction of decreasing the nitrogen concentration, the carbon concentration, and the silicon concentration. Then, as a result, the silicon oxide film (SiO film) can be formed on the wafer 200 as the insulating film.

In the third sequence as well, when the film formation is carried out in the low temperature zone of 450° C. or less for example, a generation amount of the oxidation species can be reduced, and the oxidizing power can be weakened. Then, the C-component in the first layer can be reduced to the impurity level without being reduced, and the first layer can be modified to the SiOC layer. As a result, the silicon oxycarbide film (SiOC film) can be formed on the wafer 200 as the insulating film.

(Fourth Sequence)

Next, a fourth sequence of this embodiment will be described.

Figure 8:
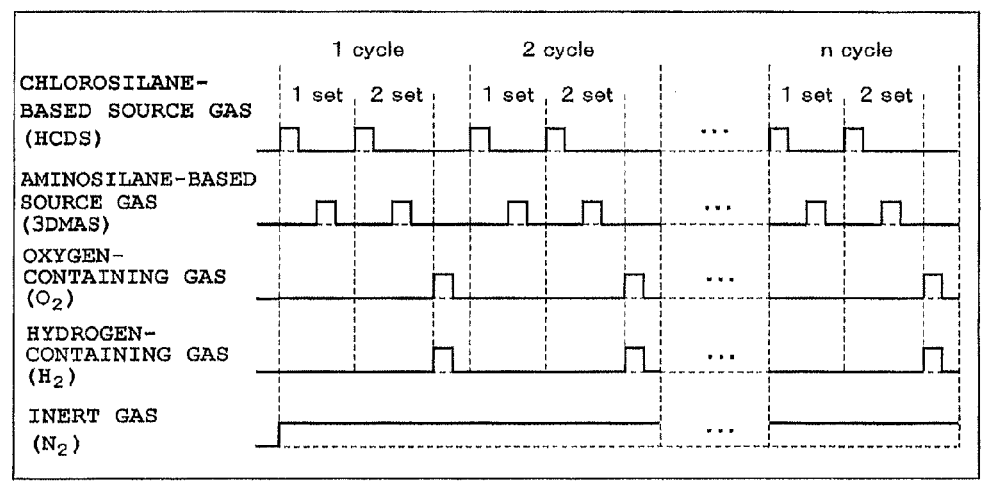
FIG. 8 is a view showing the timing of supplying gas in a fourth sequence of this embodiment.

In the above-mentioned second sequence, explanation is given for the example of thermally oxidizing the first layer using the oxygen-containing gas in step 3. However, the first layer may be thermally oxidized using the oxygen-containing gas and the hydrogen-containing gas in step 3, as shown in the fourth sequence described below. FIG. 8 is a view showing the timing of supplying gas in the fourth sequence of this embodiment.

In the fourth sequence of this embodiment, a silicon oxycarbonitride film or a silicon oxycarbide film having a specific composition and a specific film thickness, is formed on a wafer 200 by alternately performing:

forming a first layer containing silicon, nitrogen and carbon on the wafer 200 by supplying one of the sources of a chlorosilane-based source and an aminosilane-based source to the wafer 200 in a processing chamber 201, and thereafter supplying the other source thereto, and alternately repeating this cycle; and forming a silicon oxycarbonitride layer or a silicon oxycarbide layer as a second layer by oxidizing the first layer by supplying an oxygen-containing gas and a hydrogen-containing gas to the wafer 200 in the processing chamber 201 under depressurization.

FIG. 8 shows an example of supplying the chlorosilane-based source and thereafter supplying the aminosilane-based source to the wafer 200 in the processing chamber 201, namely an example of supplying the chlorosilane-based source prior to the aminosilane-based source.

Namely, in this sequence, the hydrogen-containing gas is supplied in step 3 of the above-mentioned second sequence, together with the oxygen-containing gas. This sequence is different from the second sequence only in this point, and, the other point can be performed similarly to the second sequence. In this sequence, when the $O_2$ gas is flowed into the third gas supply tube 232c by opening the valve 243c of the third gas supply tube 232c, the valve 243d of the fourth gas supply tube 232d is further opened, and the $H_2$ gas is flowed into the fourth gas supply tube 232d, to thereby supply the thermally activated $O_2$ gas and the $H_2$ gas together to the wafer 200 heated in the processing chamber 201 under depressurization. The processing conditions similar to those of the above-mentioned third sequence can be used as the other processing conditions in this sequence.

Thus, by supplying the hydrogen-containing gas to the wafer 200 heated in the processing chamber 201 under depressurization of less than atmospheric pressure together with the oxygen-containing gas, the oxygen-containing gas and the hydrogen-containing gas are reacted each other in the processing chamber 201, and oxidation species not containing water component ($H_2O$) containing oxygen such as atomic oxygen (O), etc., is generated, and similarly to the third sequence, oxidation can be carried out with higher oxidizing power than a case of oxidizing the first layer using the oxygen-containing gas alone, or using steam ($H_2O$). At this time, Si—N bond, Si—C bond and Si—Si bond are reduced, while Si—O bond is increased in the first layer by the action of the thermal oxidation by the oxidation species, and the ratio of the N-component and the ratio of the C-component in the first layer are reduced.

In the fourth sequence, similarly to the second sequence, step 3 is performed after repeating multiple numbers of times a set of steps 1 and 2 with these steps as one set, and therefore the thickness of the first layer oxidized in step 3 can be made thick. Namely, the ratio of the Si-component, the C-component, and the N-component in the first layer oxidized in step 3, can be increased. Thus, in step 3, the C-component and the N-component in the first layer are prevented from being reduced to the impurity level or prevented from disappearing substantially, so that these components can be remained in the layer. As a result, the silicon oxycarbonitride film (SiOCN film) or the silicon oxycarbide film (SiOC film) can be formed on the wafer 200 as the insulating film. Further, by increasing the number of sets, the number of layers formed per one cycle can be increased by the number of sets, and the cycle rate can be improved. Thus, the film formation rate can also be improved.

According to first to fourth sequences of this embodiment, when the insulating film is formed using the chlorosilane-based source and the aminosilane-based source, a silicon insulating film having a desired composition with high silicon density can be formed in the low temperature zone. Further, the silicon insulating film having an ideal stoichiometric mixture ratio can be formed. According to an experiment by inventors of the present invention, when the chlorosilane-based source alone is used, it is difficult to deposit silicon on the wafer at the film formation rate of satisfying production efficiency in the temperature zone of 500° C. or less. Further, when the aminosilane-based source alone is used, deposition of the silicon on the wafer is not confirmed in the temperature zone of 500° C. or less. However, according to a technique of this embodiment, an excellent silicon insulating film can be formed at the film formation rate of satisfying the production efficiency even in the low temperature zone of 500° C. or less.

When the film formation temperature is lowered, usually a kinetic energy of molecules is lowered, thus hardly causing a reaction/desorption of chlorine contained in the chlorosilane-based source and amine contained in the aminosilane-based source, and ligands of them are remained on the wafer surface. Then, due to a steric hindrance of such remained ligands, adsorption of silicon on the wafer surface is inhibited, thus reducing the silicon density, resulting in deterioration of the film. However, even under a condition in which such a reaction/desorption hardly is hardly caused, the remained ligands can be desorbed by properly causing a reaction between two silane sources, namely the chlorosilane-based source and the aminosilane-based source. Then, the steric hindrance is solved by the desorption of the remained ligands, and silicon can be adsorbed on a site opened thereby, thus obtaining a high silicon density. Thus, it can be considered that a film with high silicon density can be formed even in the low temperature zone of 500° C. or less.

Further, according to first to fourth sequences of this embodiment, the chlorosilane-based source is supplied, and thereafter the aminosilane-based source is supplied to thereby form the first layer, namely, the silicon insulating layer containing Si, N, and C on the wafer, and thereafter the gas including the oxygen-containing gas is further supplied. Therefore, the nitrogen concentration, the carbon concentration, and the oxygen concentration of the silicon insulating layer can be adjusted, and the silicon insulating film having a desired characteristic can be formed while controlling the composition ratio.

Further, by using the silicon insulating film formed by the technique of this embodiment as a side wall spacer, a device formation technique with little leak current and excellent processability can be provided.

Further, by using the silicon insulating film formed by the technique of this embodiment as an etching stopper, the device formation technique excellent in processability can be provided.

According to this embodiment, the silicon insulating film having the ideal stoichiometric mixture ratio can be formed without using plasma even in the low temperature zone. Further, since the silicon insulating film can be formed without using plasma, the present invention can be applied to a process such as OPT and SADP film, etc., in which plasma damage is a factor that is concerning.

In the above-mentioned embodiment, explanation is given for the example of supplying the chlorosilane-based source to the wafer 200 in the processing chamber 201, and thereafter supplying the aminosilane-based source thereto, when forming the first layer containing Si, N, and C in each sequence. However, a flowing manner of the sources may be reversed. Namely, the aminosilane-based source is supplied, and thereafter the chlorosilane-based source may be supplied. Namely, one of the chlorosilane-based source and the aminosilane-based source is supplied, and thereafter the other source may be supplied. Thus, by changing an order of flowing the sources, a film quality and the composition ratio of the thin film formed in each sequence can be changed.

Further, by changing not only the order of flowing the chlorosilane-based source and the aminosilane-based source, but also the order of flowing all gases including the chlorosilane-based source and the aminosilane-based source, the film quality and the composition ratio of the thin film formed in each sequence can be changed.

Further, in the above-mentioned embodiment, explanation is given for the example of using the chlorosilane-based source and the aminosilane-based source when forming the first layer containing Si, N, and C in each sequence. However, a silane-based source having halogen-based ligands other than the chlorosilane-based source may also be used, instead of the chlorosilane-based source. For example, a fluorosilane-based source may be used instead of the chlorosilane-based source. Here, the fluorosilane-based source is the silane-based source having a fluoro-group as a halogen-group, and is the source containing at least silicon (Si) and fluorine (F).

For example, tetrafluorosilane, namely silicontetrafluoride ($SiF_4$) gas and a siliconfluoride gas such as hexafluorodisilane ($Si_2F_6$) gas, etc., can be used as the fluorosilane-based source gas. In this case, when forming the first layer containing Si, N, and C in each sequence, the fluorosilane-based source is supplied to the wafer 200 in the processing chamber 201, and thereafter the aminosilane-based source is supplied thereto, or the aminosilane-based source is supplied thereto, and thereafter the fluorosilane-based source is supplied.

Further, in the above-mentioned embodiment, when forming the first layer containing Si, N, and C in each sequence, explanation is given for the example of supplying the chlorosilane-based source to the wafer 200 in the processing chamber 201, and thereafter supplying the aminosilane-based source thereto. However, as shown in FIG. 9 and FIG. 10, a CVD reaction may be caused by simultaneously supplying the chlorosilane-based source and the aminosilane-based source to the wafer 200 in the processing chamber 201.

Figure 9:
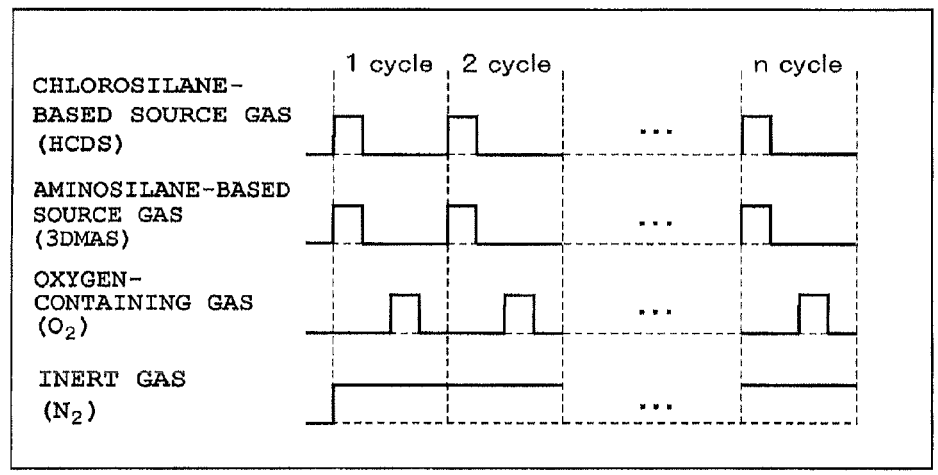
FIG. 9 is a view showing the timing of supplying gas in other embodiment.
Figure 10:
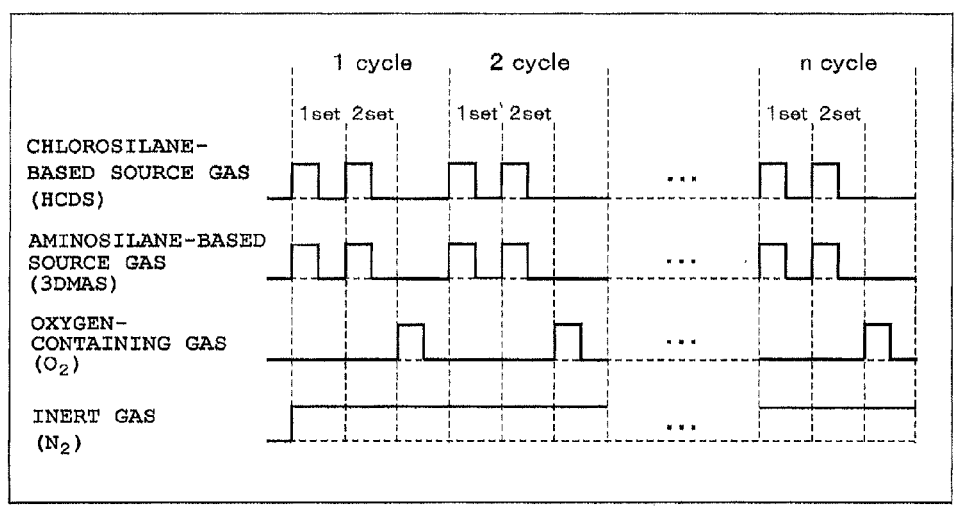
FIG. 10 is a view showing the timing of supplying gas in other embodiment.

FIG. 9 and FIG. 10 are views showing the timing of supplying gas according to other embodiment of the present invention, in which the chlorosilane-based source and the aminosilane-based source are simultaneously supplied. The processing conditions similar to the processing conditions in each sequence of the above-mentioned embodiment may be used as the processing conditions in this case.

FIG. 9 and FIG. 10 show an example of forming a silicon oxycarbonitride film (SiOCN film) or a silicon oxycarbide film (SiOC film) having a specific composition and a specific film thickness by alternately performing:

forming a first layer containing silicon, nitrogen, and carbon on a wafer 200, by simultaneously supplying a chlorosilane-based source (HCDS) and an aminosilane-based source (3DMAS) to the wafer 200 in a processing chamber 201; and forming a silicon oxycarbonitride layer (SiOCN layer) or a silicon oxycarbide layer (SiOC layer) as a second layer by modifying the first layer, by supplying an oxygen-containing gas ($O_2$) as a reaction gas, to the wafer 200 in the processing chamber 201. FIG. 9 shows a case of performing simultaneously supplying the HCDS and 3DMAS once in forming the first layer, and FIG. 10 shows a case of performing simultaneously supplying the HCDS and 3DMAS multiple numbers of times (twice) in forming the first layer.

Thus, even in a case that the chlorosilane-based source and the aminosilane-based source are not sequentially supplied to the wafer 200 in the processing chamber 201, but are supplied thereto simultaneously, the similar effect as the effect of the above-mentioned embodiment can be obtained. However, the chlorosilane-based source and the aminosilane-based source can be properly reacted under a condition that a surface reaction is dominant, and high controllability for control of the film thickness can be obtained, by sequentially supplying each source, namely, alternately supplying the sources, with purge of the inside of the processing chamber 201 interposed between them.

Further, in the above-mentioned embodiment, explanation is given for the example of forming one kind of the thin film (single film) at once on the wafer in the processing chamber in each sequence. However, a laminated film composed of two kinds or more thin films can also be formed at once on the wafer in the processing chamber, by suitably combining the above-mentioned each sequence. For example, by alternately performing the first sequence (FIG. 5) and the second sequence (FIG. 6) in-situ, the laminated film in which the SiOCN film and the SiOC film are alternately laminated, can be formed. Further, for example, by performing the first sequence (FIG. 5) and the third sequence (FIG. 7) in the processing chamber in-situ, the laminated film in which the SiOCN film and the SiOC film are alternately laminated, and the laminated film in which the SiOCN film and the SiO film are alternately laminated, and the laminated film in which the SiOC film and the SiO film are alternately laminated, can be formed. Further, the laminated film in which the SiO film, the SiOC film, and the SiOCN film are laminated, can also be formed.

Thus, the present invention can be suitably applied to the case of forming not only the single film but also the laminated film, and in this case as well, the similar effect as the effect of the above-mentioned embodiment can be obtained.

Further, in the above-mentioned embodiment, explanation is given for the example of forming the silicon-based insulating film containing silicon being a semiconductor element (SiOCN film, SiOC film, and SiO film), as the oxycarbonitride film, the oxycarbide film, and the oxide film. However, the present invention can be applied to a case of forming a metal thin film containing metal elements such as titanium (Ti), zirconium (Zr), hafnium (Hf), tantalum (Ta), aluminum (Al) and molybdenum (Mo), etc.

For example, the present invention can be applied to a case of forming a titanium oxycarbonitride film (TiOCN film), a titanium oxycarbide film (TiOC film), titanium oxide film (TiO film), or a Ti-based thin film obtained by combining these films, or a laminated film of them.

Further for example, the present invention can also be applied to a case of forming a zirconium oxycarbonitride film (ZrOCN film), a zirconium oxycarbide film (ZrOC film), a zirconium oxide film (ZrO film) or a Zr-based thin film obtained by combining or mixing them, or a laminated film of them.

Further for example, the present invention can also be applied to a case of forming a hafnium oxycarbonitride film (HfOCN film), a hafnium oxycarbide film (HfOC film), a hafnium oxide film (HfO film), or an Hf-based thin film obtained by combining or mixing them, or a laminated film of them.

Further for example, the present invention can be applied to a case of forming a tantalum oxycarbonitride film (TaOCN film), a tantalum oxycarbide film (TaOC film), a tantalum oxide film (TaO film), or a Ta-based thin film obtained by combining or mixing them, or a laminated film of them.

Further for example, the present invention can be applied to a case of forming an aluminum oxycarbonitride film (AlOCN film), an aluminum oxycarbide film (AlOC film), an aluminum oxide film (AlO film), or an Al-based thin film obtained by combining or mixing them, or a laminated film of them.

Further for example, the present invention can be applied to a case of forming a molybdenum oxycarbonitride film (MoOCN film), a molybdenum oxycarbide film (MoOC film), a molybdenum oxide film (MoO film), or a Mo-based thin film obtained by combining or mixing them, or a laminated film of them.

In this case, the filth formation can be performed using a similar sequence as the sequence of the above-mentioned embodiment, using the source (first source) containing the metal element and the halogen-group instead of the chlorosilane-based source of the above-mentioned embodiment, and using the source (second source) containing the metal element and the amino-group instead of the aminosilane-based source of the above-mentioned embodiment. For example, the source containing the metal element and the chloro-group, and the source containing the metal element and the fluoro-group can be used, as the first source.

Namely, in this case, the metal oxycarbonitride film, the metal oxycarbide film, or the metal oxide film having the specific composition and the specific film thickness is formed on the wafer 200, by alternately performing the specific number of times:

forming the first layer containing the metal element, nitrogen and carbon on the wafer 200 by alternately performing supplying the source containing the metal element and the halogen-group to the wafer 200 in the processing chamber 201, and supplying the source containing the metal element and the amino-group to the wafer 200 in the processing chamber 201; and forming the metal oxycarbonitride layer, the metal oxycarbide layer, or the metal oxide layer as the second layer, by supplying the oxygen-containing gas, or the oxygen-containing gas and the hydrogen-containing gas to the wafer 200 in the processing chamber 201.

For example, when the Ti-based thin film is formed as the metal thin film, the source containing Ti and the chloro-group such as titaniumtetrachloride ($TiCl_4$), etc., or the source containing Ti and the fluoro-group such as titaniumtetrafluoride ($TiF_4$), etc., can be used as the first source. Also, the source containing Ti and the amino-group such as tetrakisethylmethylaminotitanium ($Ti[N(C_2H_5)(CH_3)]_4$, etc., abbreviated as TEMAT), tetrakisdimethylaminotitanium ($Ti[N(CH_3)_2]_4$, abbreviated as TDMAT), tetrakisdiethylaminotitanium ($Ti[N(C_2H_5)_2]_4$, abbreviated as TDEAT), etc., can be used as the second source. Also, the similar gas as the gas of the above-mentioned embodiment can be used as the oxygen-containing gas and the hydrogen-containing gas. The similar processing conditions as those of the above-mentioned embodiment can be used as the processing conditions at this time.

Further for example, when the Ti-based thin film is formed as the metal thin film, the source containing Ti and the chloro-group such as titaniumtetrachloride ($TiCl_4$), etc., and the source containing Ti and the fluoro-group such as titaniumtetrafluoride ($TiF_4$), etc., can be used as the metal thin film. The source containing Ti and the amino-group such as tetrakisethylmethylaminotitanium ($Ti[N(C_2H_5)(CH_3)]_4$, abbreviated as TEMAT), tetrakisdimethylaminotitanium ($Ti[N(CH_3)_2]_4$ abbreviated as TDEAT), and tetrakisdiethylaminotitanium ($Ti[N(C_2H_5)_2]_4$, abbreviated as TDEAT), etc., can be used as the second source. The similar gas as the gas of the above-mentioned embodiment can be used as the oxygen-containing gas and the hydrogen-containing gas. Further, similar processing conditions as the above-mentioned embodiment can be used as the processing conditions at this time.

Further for example, when the Zr-based thin film is formed as the metal thin film, the source containing Zr and the chloro-group such as zirconiumtetrachloride ($ZrCl_4$), etc., and the source containing Zr and the fluoro-group such as zirconiumtetrafluoride ($ZrF_4$), etc., can be used as the metal thin film. The source containing Zr and the amino-group such as tetrakisethylmethylaminozirconium ($Zr[N(C_2H_5)(CH_3)]_4$, abbreviated as TDMAZ), tetrakisdimethyl-aminozirconium ($Zr[N(CH_3)_2]_4$, abbreviated as TDMAZ), and tetrakisdiethylaminozirconium ($Zr[N(O_2H_5)_2]_4$, abbreviated as TDEAZ), etc., can be used as the second source. The similar gas as the gas of the above-mentioned embodiment can be used as the oxygen-containing gas and the hydrogen-containing gas. Further, similar processing conditions as the above-mentioned embodiment can be used as the processing conditions at this time.

Further for example, when the Hf-based thin film is formed as the metal thin film, the source containing Hf and the chloro-group such as hafniumtetrachloride ($HfCl_4$), etc., and the source containing Hf and the fluoro-group such as hafniumtetrafluoride ($HfF_4$), etc., can be used as the metal thin film. The source containing Hf and the amino-group such as tetrakisethylmethylaminohafnium ($Hf[N(C_2H_5)(CH_3)]_4$, abbreviated as TEMAH), tetrakisdimethylamino-hafnium ($Hf[N(CH_3)_2]_4$, abbreviated as TDMAH), and tetrakisdiethylaminohafnium ($Hf[N(C_2H_5)_2]_4$, abbreviated as TDEAH), etc., can be used as the second source. The similar gas as the gas of the above-mentioned embodiment can be used as the oxygen-containing gas and the hydrogen-containing gas. Further, similar processing conditions as the above-mentioned embodiment can be used as the processing conditions at this time.

Thus, the present invention can be applied not only to the silicon-based thin film, but also to the film formation of the metal thin film, and even in this case, the similar effect as the effect of the above-mentioned embodiment can be obtained.

Namely, the present invention can also be applied to the case of forming the thin film containing the specific element such as the semiconductor element and the metal element, etc.

Further, explanation is given for the example of performing film formation using the batch-type substrate processing apparatus for processing a plurality of substrates at once. However, the present invention is not limited thereto, and can be suitably applied to a case of performing film formation using a single wafer-type substrate processing apparatus for processing one or a plurality of substrates at once.

Further, each modified example or each application example, etc., of the above-mentioned each embodiment, can be used suitably in combination.

Further, the present invention can also be realized by changing the process recipe of the existing substrate processing apparatus. When the process recipe is changed, the process recipe of the present invention can be installed in the existing substrate processing apparatus via an electric communication line or a recording medium in which the process recipe is recorded, or the process recipe itself can be changed to the process recipe of the present invention by operating the input/output device of the existing substrate processing apparatus.

In the case of the conventional CVD method, a plurality of kinds of gases containing a plurality of elements constituting the thin film to be formed, are simultaneously supplied. In this case, in order to control the composition ratio of the formed thin film, control of a gas supply flow ratio during supply of the gas is taken into consideration. In this case, the composition ratio of the formed thin film cannot be controlled even if the supply conditions such as the substrate temperature, the pressure in the processing chamber, and the time for supplying gas, or the like, are controlled during supply of the gas.

Further, in the case of the ALD method, a plurality of kinds of gases containing a plurality of elements constituting the formed thin film, are alternately supplied. In this case, in order to control the composition ratio of the formed thin film, control of the gas supply flow rate and gas supply time during supply of each gas is taken into consideration. In the case of the ALD method, the source gas is supplied for the purpose of its adsorption and saturation on the substrate surface, and therefore pressure control of the inside of the processing chamber is not required. Namely, adsorption and saturation of the source gas occurs under not more than a specific pressure under which the adsorption of the source gas occurs at a reaction temperature. Therefore, by setting the pressure in the processing chamber to not more than the specific pressure, the adsorption and saturation of the source gas can be realized at any pressure value. Accordingly, when the film formation is performed by the ALD method, usually the pressure in the processing chamber is determined depending on an exhaust ability of the substrate processing apparatus with respect to the gas supply amount. Due to the change of the pressure in the processing chamber, it can be considered that a chemical adsorption of the source gas on the substrate surface is inhibited, or the reaction is probably close to the CVD reaction. Thus, the film formation by the ALD method cannot be suitably performed in some cases. Further, in order to form the thin film having the specific film thickness by the ALD method, the ALD reaction (adsorption and saturation, surface reaction) is repeatedly performed. Therefore, deposition is insufficient and probably a sufficient deposition rate cannot be obtained, unless each ALD reaction is sufficiently caused until each ALD reaction is saturated. Therefore, in the case of the ALD method, control of the composition ratio by controlling the pressure in the processing chamber, is hardly taken into consideration.

Meanwhile, according to this embodiment, in anyone of the sequences, the composition ratio of the thin film is controlled (finely adjusted) by controlling the pressure in the processing chamber and the gas supply time in each step. Preferably, the composition ratio of the thin film is preferably controlled by controlling the pressure in the processing chamber or the pressure and the gas supply time.

When the composition ratio of the thin film is controlled by controlling the pressure in the processing chamber by controlling the pressure in the processing chamber in each step, an influence of a difference of machines between different substrate processing apparatuses can be reduced. Namely, even in the different substrate processing apparatuses, the composition ratio of the thin film can be similarly controlled by similar control. In this case, by controlling the gas supply time as well in each step, the composition ratio of the thin film can be finely adjusted and the controllability of controlling the composition ratio of the thin film can be improved. Further, by controlling the pressure in the processing chamber in each step, the composition ratio of the thin film can also be controlled while increasing the film formation rate. Namely, by controlling the pressure in the processing chamber, the composition ratio of the thin film can also be controlled while increasing the film formation rate of the silicon-containing layer formed in step 1 in each sequence for example. Thus, according to this embodiment, by a similar control among different substrate processing apparatuses, the composition ratio of the thin film can be similarly controlled, and also the controllability of controlling the composition ratio of the thin film can be improved, and further the film formation rate, namely, productivity can also be improved.

Meanwhile, in the film formation by the ALD method for example, when the composition ratio of the thin film is controlled by controlling the gas supply flow rate and the gas supply time in each step, the influence of the difference of machines becomes large between different substrate processing apparatuses. Namely, even if the similar control is performed between different substrate processing apparatuses, the composition ratio of the thin film cannot be similarly controlled. For example, even if the gas supply flow rate and the gas supply time are set to the same flow rate value and time between different substrate processing apparatuses, the pressure in the processing chamber is not the same pressure value due to the difference of machines. Therefore, in this case, the pressure in the processing chamber is changed in each substrate processing apparatus, and a desired control of the composition ratio cannot be similarly performed between different substrate processing apparatuses. Further, due to the change of the pressure in the processing chamber in each substrate processing apparatus, it can be considered that a chemical adsorption of the source gas on the substrate surface is inhibited, or the reaction is close to the CVD reaction. Thus, the film formation by the ALD method cannot be suitably performed in some cases.

EXAMPLES

Example 1

Figure 11:
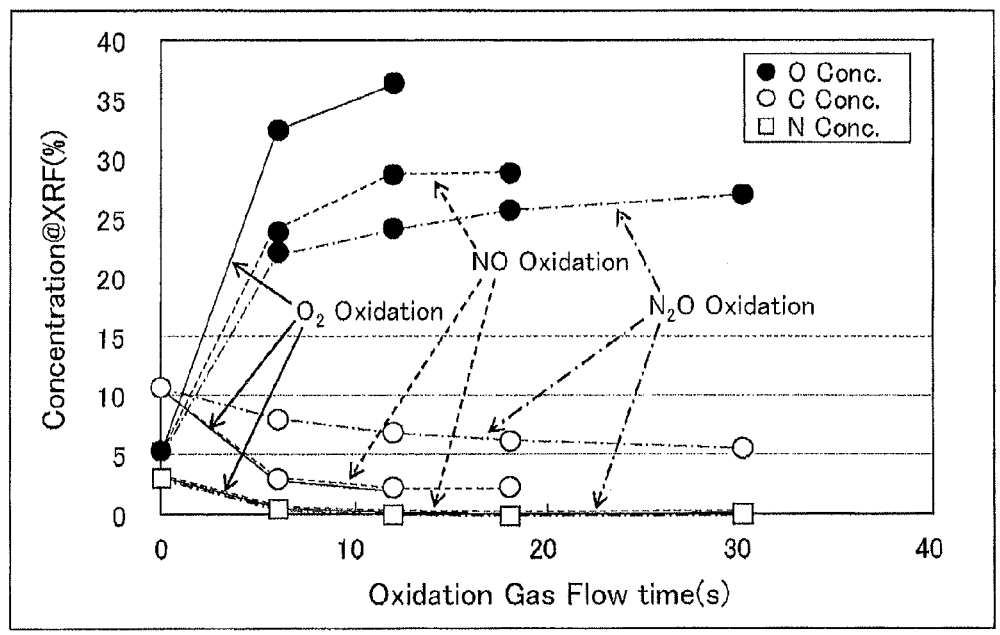
FIG. 11 is a graph chart showing a measurement result of XRF according to example 1 of the present invention.

Using the first sequence in the above-mentioned embodiment, the gas species of the oxygen-containing gas and the supply time of the oxygen-containing gas in step 3 were respectively changed, and the SiOCN film or the SiOC film was formed on the wafer, to thereby measure the O-concentration, C-concentration, and N-concentration of each film formed at this time by XRF. In this example, the HCDS gas was used as the chlorosilane-based source gas, and the 3DMAS gas was used as the aminosilane-based source gas, the $O_2$ gas, NO gas, and $N_2$ gas were used as the oxygen-containing gas, to thereby form the SiOCN film or the SiOC film using the sequence of FIG. 3 and FIG. 5. The processing conditions in each step at this time were set as follows.
(Step 1)
Temperature in the processing chamber: 550° C.
Pressure in the processing chamber: 399 Pa (3 Torr)
Supply flow rate of the HCDS gas: 200 sccm
Irradiation time of the HCDS gas: 12 seconds
(Step 2)
Temperature in the processing chamber: 550° C.
Pressure in the processing chamber: 10 Pa (0.075 Torr)
Supply flow rate of the 3DMAS gas: 200 sccm
Irradiation time of the 3DMAS gas: 6 seconds
(Step 3)
Temperature in the processing chamber: 550° C.
Pressure in the processing chamber: 10 Pa (0.075 Torr)
Supply flow rate of the 3DMAS gas: 1000 sccm
Irradiation time of the 3DMAS gas: 0 to 30 seconds FIG. 11 is a graph chart showing measurement results of the XRF according to this example, wherein the horizontal axis indicates the supply time (second) of the oxygen-containing gas, and the vertical axis indicates the O-concentration, C-concentration, and N-concentration (arbitrary unit (a.u.)) respectively. In the figure, ● indicates the O-concentration, ○ indicates the C-concentration, and □ indicates the N-concentration respectively. Further, in the figure, solid line indicates a case of using the $O_2$ gas as the oxygen-containing gas, and broken line indicates a case of using the NO gas as the oxygen-containing gas, and one dot chain line indicates the case of using the $N_2O$ gas respectively. Further, Oxidation Gas Flow time(s) zero indicates a case of not supplying the oxygen-containing gas, namely indicates a case of forming a substance containing Si, C, and N (simply called SiCN hereafter) using the sequence of FIG. 3 in which step 1 and step 2 are alternately repeated.

As shown in FIG. 11, in the case of not supplying the oxygen-containing gas (comparative example), it is found that the C-concentration is high, and C-rich SiCN is formed. It is also found that the C-concentration is twice or more higher than the N-concentration. According to FIG. 11, it appears that O is contained in SiCN. However, O in this case is detected in an interface between SiCN and an underlayer, or on the surface of the SiCN, and is not the component in the SiCN, and therefore is not taken into consideration here. Meanwhile, in the case of supplying the oxygen-containing gas (example), it is found that oxidation occurs by supplying the oxygen-containing gas even in the case of using any one of the $O_2$ gas, NO gas, and $N_2O$ gas, and the SiCN is changed to the SiOCN film. It is also found that as the supply time of the oxygen-containing gas becomes longer, the oxidation is progressed and the O-concentration (●) is increased, and the C-concentration (○) and the N-concentration (□) are decreased. Then, it is found that when the oxidation is progressed to some extent by prolonging the supply time of the oxygen-containing gas to some extent, the N-component is decreased to an impurity level, and by further prolonging the supply time of the oxygen-containing gas, oxidation is further progressed and the N-component disappears substantially, to thereby form the SiOC film. It is also found that the O-concentration in the film is highest (solid line) in the case of using the $O_2$ gas as the oxygen-containing gas, and next high (broken line) in the case of using the NO gas, and the next high (one dot chain line) in the case of using the $N_2O$ gas. It is also found that the C-concentration in the film is lower in the case of using the $O_2$ gas or the NO gas as the oxygen-containing gas (solid line) than the case of using the $N_2O$ gas (one dot chain line).

Namely, in this example, it is found that owing to the action of the thermal oxidation by the oxygen-containing gas in step 3, the SiOCN film is formed while increasing the ratio of the O-component, and decreasing the ratio of the C-component, and further decreasing the ratio of the N-component. It is also found that owing to the action of the thermal oxidation by the oxygen-containing gas in step 3, the SiOC film is formed while increasing the ratio of the O-component, decreasing the ratio of the C-component, and further decreasing the ratio of the N-component to the impurity level (or substantially disappears). The film formation rate of the SiOCN film and the SiOC film formed in this example, was 0.6 Å/cycle or more in the case of using any one of the $O_2$ gas, the NO gas, and the $N_2O$ gas, and the uniformity of the film thickness in the wafer plane was 1.7% or less. Namely, it is found that an excellent silicon insulating film can be formed while controlling the composition ratio at the film formation rate of satisfying the production efficiency even in the low temperature zone of 550° C.

Example 2

The SiOC film was formed on the wafer using the first sequence of the above-mentioned embodiment, to thereby measure the O-concentration, the C-concentration, and the N-concentration of the SiOC film by XPS. Further, an etching rate and a dielectric constant k of the SiOC film were measured. In this example, the HCDS gas was used as the chlorosilane-based source, and the 3DMAS gas was used as the aminosilane-based source gas, and the $N_2O$ gas was used as the oxygen-containing gas, to thereby form the SiOC film using the sequence of FIG. 3 and FIG. 5. The processing conditions in each step at this time were set as follows.

As comparative example 1, the SiOCN film was formed on the wafer by an alternate supply method of repeating a cycle of supplying the HCDS gas, supplying the propylene ($C_3H_6$) gas, supplying the ammonia ($NH_3$) gas, and supplying the $O_2$ gas, with this cycle as one set, and repeating this cycle n-number of times, to thereby measure the O-concentration, the C-concentration, and the N-concentration of the SiOCN film by XPS. Further, the etching rate and the dielectric constant k of the SiOCN film of comparative example 1 were measured.

Further, as comparative example 2, the SiN film was formed by the alternate supply method of repeating the cycle of supplying the DCS gas and supplying the $NH_3$ gas, with this cycle as one set, and repeating this cycle n-number of times, to thereby measure the etching rate and the dielectric constant k of the SiN film.

Figure 12:
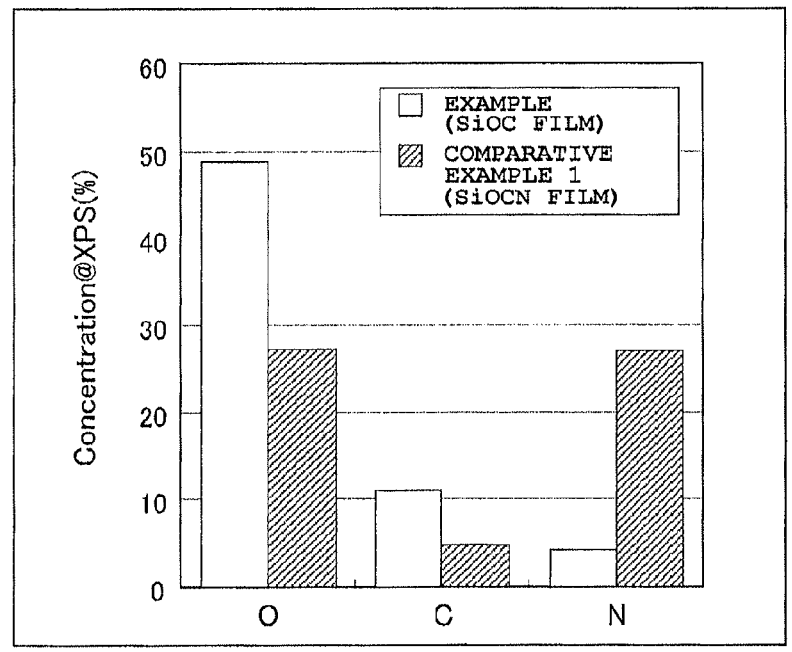
FIG. 12 is a graph chart showing the measurement result of an XPS spectrum according to example 2 of the present invention.

FIG. 12 is a graph chart showing the measurement results of an XPS spectrum of the SiOC film of this example and the SiOCN film of comparative example 1. In FIG. 12, the vertical axis indicates the concentration (%), and the horizontal axis indicates each element of O, C, N. According to FIG. 12, it is found that the O-concentration is higher, the C-concentration is higher and the N-concentration is lower in the SiOC film of this example, than those of the SiOCN film of comparative example 1. Particularly in this example, the N-concentration is decreased to the impurity level in the SiOC, film of this example. This reveals that in the SiOCN film of comparative example 1, C is decreased to the impurity level prior to N, or disappears substantially, to thereby change the SiOCN film to the SiON film. Meanwhile, the SiOC film of this example is a result of being changed thereto by decrease of N of the SiOCN film to the impurity level due to oxidation. Namely, in this example, it is found that the SiOCN film is changed to the SiOC film if N is decreased to the impurity level prior to C in the SiOCN film, or disappears substantially.

Figure 13:
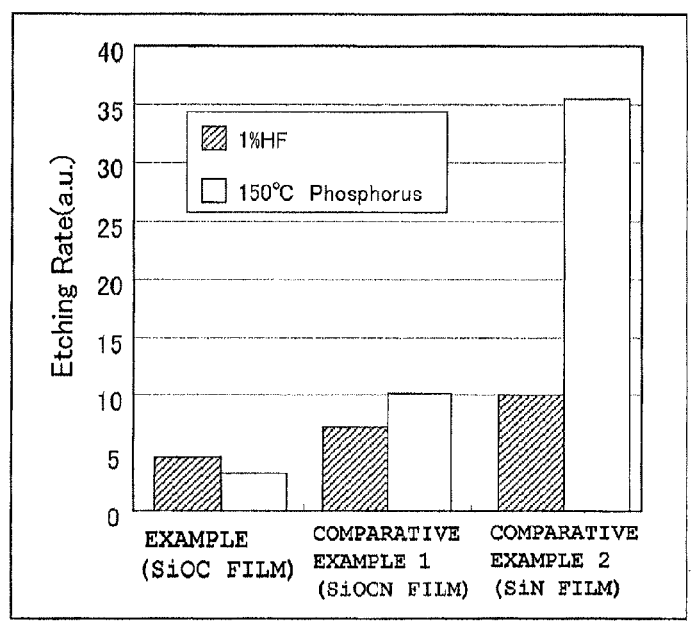
FIG. 13 is a graph chart showing the measurement result of an etching rate according to example 2 of the present invention.

FIG. 13 is a graph chart showing the measurement results of the etching rate when etching is applied to the SiOC film of this example, the SiOCN film of comparative example 1, and the SiN film of comparative example 2, using a hydrogen fluoride (HF) aqueous solution having a concentration of 1%, and the etching rate when etching is applied thereto using a hot phosphoric acid aqueous solution of 150° C. In FIG. 13, the vertical axis indicates the etching rate (arbitrary unit (a.u.)), and the horizontal axis indicates example and comparative example 1 and 2. According to FIG. 13, it is found that even if using either one of the HF aqueous solution and the hot phosphoric acid aqueous solution, the etching rate of the SiOC film of this example is lowest compared with the etching rate of the SiOCN film of comparative example 1 and the SiN film of comparative example 2. Namely, it is found that the SiOC film of this example has a high resistance to HF and hot phosphoric acid respectively. This shows a result that does not contradict a general film characteristic that HF resistance is improved with high C-concentration, and the hot phosphoric acid resistance is improved with low N-concentration. The etching rate for 1% HF aqueous solution of the SiOC film according to this example, was 10 Å/min or less.

Figure 14:
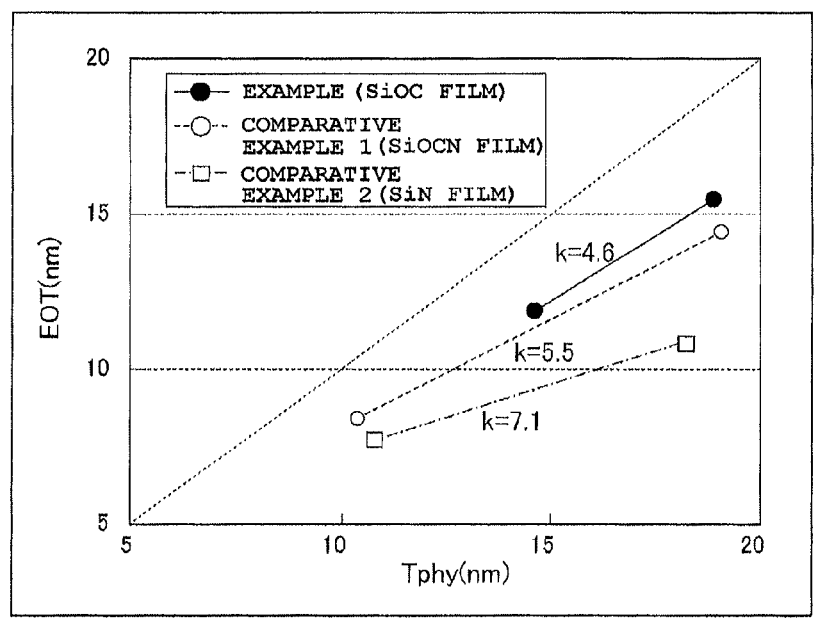
FIG. 14 is a graph chart showing the measurement result of a dielectric constant according to example 2 of the present invention.

FIG. 14 is a graph chart showing the measurement results of the dielectric constant k of the SiOC film of this example, the SiOCN film of comparative example 1, and the SiN film of comparative example 2 respectively. In FIG. 14, the horizontal axis indicates an optical film thickness (nm), and the vertical axis indicates ECT being an electric film thickness, namely equivalent oxide thickness (nm). Namely, FIG. 14 shows a relation between the optical film thickness and the electric film thickness of each film. In FIG. 14, ● indicates the equivalent oxide thickness of the SiOC film of this example, ○ indicates the equivalent oxide thickness of the SiOCN film of comparative example 1, and □ indicates the equivalent oxide thickness of comparative example 2 respectively. The dielectric constant k can be calculated from an inclination of the graph. The dielectric constant k becomes small as the inclination becomes large, and is equal to the dielectric constant k of the thermal oxide film ($SiO_2$ film) when the inclination is 1. According to FIG. 14, it is found that the dielectric constant k of the SiOC film of this example is 4.6, and the dielectric constant k of the SiOCN film of comparative example 1 is 5.5, and the dielectric constant k of the SiN film of comparative example 2 is 7.1. Namely, it is found that the dielectric constant of 5 or less can be realized in the SiOC film of this example.

This reveals as follows. Namely, in this example, the SiOC film having the high resistance to HF and the hot phosphoric acid and having the dielectric constant of 5 or less in the low temperature zone of 550° C. or less, can be formed.

Example 3

Figure 15:
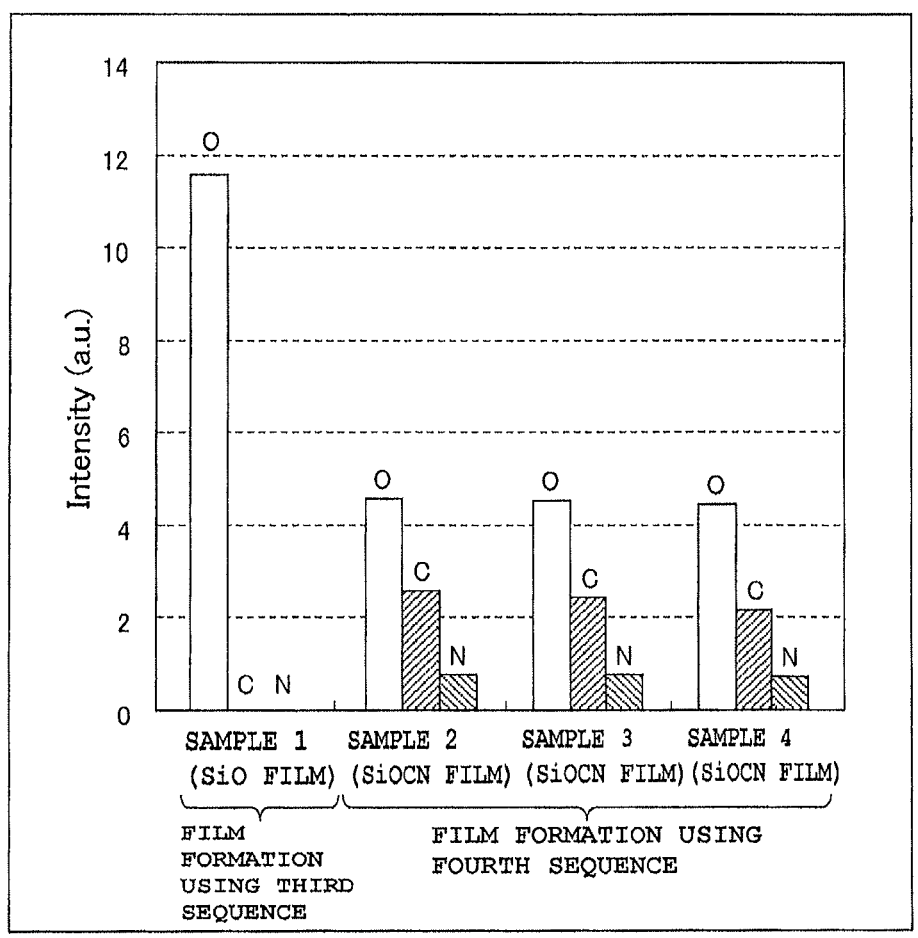
FIG. 15 is a graph chart showing the measurement result of O-concentration, C-concentration, and N-concentration according to example 3 of the present invention.

The SiO film was formed on the wafer using the third sequence of the above-mentioned embodiment as sample 1, and the O-concentration, the C-concentration, and the N-concentration of the SiO film were measured. In sample 1, the HCDS gas was used as the chlorosilane-based source gas, the 3DMAS gas was used as the aminosilane-based source gas, the $O_2$ gas was used as the oxygen-containing gas, and the $H_2$ gas was used as the hydrogen-containing gas, to thereby form the SiO film using the sequence of FIG. 7. In sample 1, a cycle of the steps 1, 2, 3 was performed multiple numbers of times, with these steps as one cycle. The processing conditions in each step were set as follows.
(Step 1)
Temperature in the processing chamber: 550° C.
Pressure in the processing chamber: 399 Pa (3 Torr)
Supply flow rate of the HCDS gas: 180 sccm
Irradiation time of the HCDS gas: 18 seconds
(Step 2)
Temperature in the processing chamber: 550° C.
Pressure in the processing chamber: 399 Pa (3 Torr)
Supply flow rate of the 3DMAS gas: 50 sccm
Irradiation time of the 3DMAS gas: 12 seconds
(Step 3)
Temperature in the processing chamber: 550° C.
Pressure in the processing chamber: 10 Pa (0.075 Torr)
Supply flow rate of the $O_2$ gas: 5000 sccm
Supply flow rate of the $H_2$ gas: 500 sccm
Irradiation time of the $O_2$ gas+$H_2$ gas: 6 seconds Further, the SiOCN film was formed on the wafer using the fourth sequence of the above-mentioned, embodiment as samples 2 to 4, and the O-concentration, the C-concentration, and the N-concentration of the SiOCN film in each sample were measured. Samples 2, 3, 4 were the samples of the SiOCN film formed on the wafer disposed in an upper part, a middle part, and a lower part respectively in the processing chamber. In samples 2 to 4, the HCDS gas was used as the chlorosilane-based source gas, and the 3DMAS gas was used as the aminosilane-based source gas, the $O_2$ gas was used as the oxygen-containing gas, and the $H_2$ gas was used as the hydrogen-containing gas, to thereby form the SiOCN film using the sequence of FIG. 8. In samples 2 to 4, one set of steps 1 and 2 was performed three times, with these steps as one set, and thereafter step 3 was performed, this sequence was set as one cycle, and this cycle was performed multiple numbers of times. The processing conditions in each step at this time, were set as follows.
(Step 1)
Temperature in the processing chamber: 500° C.
Pressure in the processing chamber: 399 Pa (3 Torr)
Supply flow rate of the HCDS gas: 180 sccm
Irradiation time of the HCDS gas: 18 seconds
(Step 2)
Temperature in the processing chamber: 500° C.
Pressure in the processing chamber: 399 Pa (3 Torr)
Supply flow rate of the 3DMAS gas: 50 sccm
Irradiation time of the 3DMAS gas: 24 seconds
(Step 3)
Temperature in the processing chamber: 500° C.
Pressure in the processing chamber: 10 Pa (0.075 Torr)
Supply flow rate of the $O_2$ gas: 5000 sccm
Supply flow rate of the $H_2$ gas: 500 sccm
Irradiation time of the $O_2$ gas+$H_2$ gas: 6 seconds FIG. 15 is a graph chart showing the measurement results of the O-concentration, the C-concentration, and the N-concentration in samples 1 to 4 respectively. In FIG. 15, the vertical axis indicates intensity, namely, the intensity of each element (arbitrary unit (a.u.)), and the horizontal axis indicates each sample.

According to FIG. 15, it is found that the SiO film is formed by desorption of the C-component and the N-component from the film in sample 1 using the third sequence. Namely, it is found that the ratio of the C-component and the N-component in the film is remarkably reduced to the impurity level or disappears substantially by the action of the thermal oxidation of the oxidation species in step 3, to thereby form the SiO film.

According to FIG. 15, it is also found that the SiOCN film is formed in samples 2 to 4 using the fourth sequence. Namely, it is found that a set of steps 1, 2 is repeated multiple numbers of times, with these steps as one set, and thereafter step 3 is performed, to thereby suppress the desorption of the C-component and the N-component from the film, so that these components are remained in the film, to thereby form the SiOCN film. It is also found that samples 2, 3, 4 in FIG. 15 are the samples of the SiOCN film formed on the wafer disposed in the upper part, the middle part, and the lower part in the processing chamber respectively, and the composition ratio can be uniformly controlled among wafers, because the composition ratio of each SiOCN film is approximately the same.

According to FIG. 15, it is also found that the SiOC film can be formed under the above-mentioned processing conditions. Namely, in sample 1, the SiO film was formed using the above-mentioned conditions as the processing conditions in each step, and in samples 2 to 4, the SiOCN film was formed using the above-mentioned conditions as the processing conditions in each step. However, data shown in FIG. 15 indicates that the C-concentration and the N-concentration in the film can be controlled by the film formation sequence and the processing conditions. Namely, according to FIG. 15, it is found that the composition ratio can be controlled to form the SiOC film for example, using a specific sequence as the film formation sequence, or using a specific condition as the processing condition in each step.

Preferable aspects of the present invention will be supplementarily described hereafter.

(Supplementary Description 1)

According to an aspect of the present invention, there is provided a method of manufacturing a semiconductor device, including:

forming an oxycarbonitride film, an oxycarbide film or an oxide film containing a specific element on a substrate by alternately performing a specific number of times:

forming a first layer containing the specific element, nitrogen and carbon, on the substrate, by alternately performing a specific number of times, supplying a first source containing the specific element and a halogen-group to the substrate in a processing chamber, and supplying a second source containing the specific element and an amino-group to the substrate in the processing chamber; and forming a second layer by oxidizing the first layer by supplying an oxygen-containing gas, or an oxygen-containing gas and a hydrogen-containing gas to the substrate in the processing chamber.

(Supplementary Description 2)

There is provided the method of the supplementary description 1, wherein in forming the first layer, supplying the first source and supplying the second source are alternately performed once;

in forming the second layer, the oxygen-containing gas is supplied; and forming the first layer and forming the second layer are alternately performed the specific number of times, to thereby form the oxycarbonitride film or the oxycarbide film containing the specific element, on the substrate.

(Supplementary Description 3)

There is provided the method of the supplementary description 1, wherein in forming the first layer, supplying the first source and supplying the second source are alternately performed multiple numbers of times; and in forming the second layer, the oxygen-containing gas is supplied; and forming the first layer and forming the second layer are alternately performed the specific number of times, to thereby form the oxycarbonitride film or the oxycarbide film containing the specific element, on the substrate.

(Supplementary Description 4)

There is provided the method of the supplementary description 1, wherein in forming the first layer, supplying the first source and supplying the second source are alternately performed once;

in forming the second layer, the oxygen-containing gas and the hydrogen-containing gas are supplied; and forming the first layer and forming the second layer are alternately performed the specific number of times, to thereby form an oxide film containing the specific element, on the substrate.

(Supplementary Description 5)

There is provided the method of the supplementary description 1, wherein in forming the first layer, supplying the first source and supplying the second source are alternately performed multiple numbers of times;

in forming the second layer, the oxygen-containing gas and the hydrogen-containing gas are supplied; and forming the first layer and forming the second layer are alternately performed the specific number of times, to thereby form the oxycarbonitride film or the oxycarbide film containing the specific element, on the substrate.

(Supplementary Description 6)

There is provided the method of the supplementary description 1, wherein in forming the second layer, the thermally activated oxygen-containing gas, or the thermally activated oxygen-containing gas and hydrogen-containing gas is supplied to the substrate in the processing chamber.

(Supplementary Description 7)

There is provided the method of the supplementary description 1, wherein in forming the second layer, an oxidation reaction of the first layer is set in an unsaturated state.

(Supplementary Description 8)

There is provided the method of the supplementary description 1, wherein the first source includes a chlorosilane-based source or a fluorosilane-based source, and the second source includes an aminosilane-based source.

(Supplementary Description 9)

According to other aspect of the present invention, there is provided a method of manufacturing a semiconductor device, including:

forming a silicon oxycarbonitride film, a silicon oxycarbide film, or a silicon oxide film on a substrate by alternately performing a specific number of times, forming a first layer containing silicon, nitrogen, and carbon, on a substrate, by alternately performing a specific number of times, supplying a first source containing silicon and a halogen-group to the substrate in a processing chamber, and supplying a second source containing silicon and an amino-group to the substrate in the processing chamber; and forming a second layer by oxidizing the first layer by supplying an oxygen-containing gas, or an oxygen-containing gas and a hydrogen-containing gas to the substrate in the processing chamber.

(Supplementary Description 10)

According to further other aspect of the present invention, there is provided a method of manufacturing a semiconductor device, including:

forming a silicon oxycarbonitride film, a silicon oxycarbide film, or a silicon oxide film on a substrate by alternately performing a specific number of times:

forming a first layer containing silicon, nitrogen, and carbon, on the substrate, by alternately performing a specific number of times, supplying a chlorosilane-based source or a fluorosilane-based source to the substrate in a processing chamber, and supplying an aminosilane-based source to the substrate in the processing chamber; and forming a second layer by oxidizing the first layer by supplying an oxygen-containing gas, or an oxygen-containing gas and a hydrogen-containing gas to the substrate in the processing chamber.

(Supplementary Description 11)

According to further other aspect of the present invention, there is provided a substrate processing method, including:

forming an oxycarbonitride film, an oxycarbide film or an oxide film containing a specific element on a substrate by alternately performing a specific number of times:

forming a first layer containing the specific element, nitrogen and carbon, on the substrate, by alternately performing a specific number of times, supplying a first source containing the specific element and a halogen-group to the substrate in a processing chamber, and supplying a second source containing the specific element and an amino-group to the substrate in the processing chamber; and forming a second layer by oxidizing the first layer by supplying an oxygen-containing gas, or an oxygen-containing gas and a hydrogen-containing gas to the substrate in the processing chamber.

(Supplementary Description 12)

According to further other aspect of the present invention, there is provided a substrate processing apparatus, including:

a processing chamber configured to house a substrate;

a first source supply system configured to supply a first source containing a specific element and a halogen-group, to a substrate in the processing chamber;

a second source supply system configured to supply a second source containing the specific element and an amino-group, to a substrate in the processing chamber:

a reaction gas supply system configured to supply an oxygen-containing gas, or an oxygen-containing gas and a hydrogen-containing gas, to a substrate in the processing chamber; and a control part configured to control the first source supply system, the second source supply system and the reaction gas supply system, so that an oxycarbonitride film, an oxycarbide film or an oxide film containing the specific element, is formed on a substrate, by alternately performing a specific number of times, a process of forming a first layer containing the specific element, nitrogen and carbon on the substrate by alternately performing a specific number of times, a process of supplying the first source to the substrate in the processing chamber, and a process of supplying the second source to the substrate in the processing chamber; and a process of forming a second layer by oxidizing the first layer by supplying the oxygen-containing gas, or the oxygen-containing gas and the hydrogen-containing gas to the substrate in the processing chamber.

(Supplementary Description 13)

According to further other aspect of the present invention, there is provided a program for making a computer execute:

a procedure of forming an oxycarbonitride film, an oxycarbide film, or an oxide film containing a specific element on a substrate by alternately performing a specific number of times:

a procedure of forming a first layer containing the specific element, nitrogen, and carbon on the substrate by alternately performing a specific number of times, a procedure of supplying a first source containing the specific element and a halogen-group to the substrate in a processing chamber of a substrate processing apparatus, and a procedure of supplying a second source containing the specific element and an amino-group to the substrate in the processing chamber; and a procedure of forming a second layer by oxidizing the first layer by supplying an oxygen-containing gas, or an oxygen-containing gas and a hydrogen-containing gas to the substrate in the processing chamber.

(Supplementary Description 14)

According to further other aspect of the present invention, there is provided a non-transitory computer-readable recording medium in which a program is recorded, for making a computer execute:

a procedure of forming an oxycarbonitride film, an oxycarbide film, or an oxide film containing a specific element on a substrate by alternately performing a specific number of times:

a procedure of forming a first layer containing the specific element, nitrogen, and carbon on the substrate by alternately performing a specific number of times, a procedure of supplying a first source containing the specific element and a halogen-group to the substrate in a processing chamber of a substrate processing apparatus, and a procedure of supplying a second source containing the specific element and an amino-group to the substrate in the processing chamber; and a procedure of forming a second layer by oxidizing the first layer by supplying an oxygen-containing gas, or an oxygen-containing gas and a hydrogen-containing gas to the substrate in the processing chamber.

DESCRIPTION OF SIGNS AND NUMERALS

121 Controller
200 Wafer
201 Processing chamber
202 Processing furnace
203 Reaction tube
207 Heater
231 Exhaust tube
232a First gas supply tube
232b Second gas supply tube
232c Third gas supply tube
232d Fourth gas supply tube

The invention claimed is:

1. A method of manufacturing a semiconductor device, comprising:
forming a film containing a specific element, oxygen, carbon and nitrogen or a film containing the specific element, oxygen and carbon on a substrate, by performing a cycle of alternately performing n times (n is an integer of one or more) (a) forming a first layer containing the specific element, carbon and nitrogen and (b) forming a second layer, while interposing purging a residual gas in-between,
wherein (a) comprises alternately performing m times (m is an integer of two or more) (a-1) supplying a first source gas to the substrate and (a-2) supplying a second source gas to the substrate, while interposing purging a residual gas in-between,
wherein the first source gas contains the specific element and a halogen-group; and
wherein the second source gas contains the specific element and an amino-group; and
wherein (b) comprises oxidizing the first layer by supplying an oxygen-containing gas, or the oxygen-containing gas and a hydrogen-containing gas to the substrate.

2. The method of claim 1, wherein the first layer includes a layer which contains the specific element, nitrogen and carbon, and in which a carbon concentration is higher than a nitrogen concentration.

3. The method of claim 1, wherein in (b), the oxygen-containing gas which is thermally activated, or the oxygen-containing gas and the hydrogen-containing gas which are thermally activated, are supplied to the substrate.

4. The method of claim 1, wherein in (b), the oxygen-containing gas which is thermally activated by non-plasma, or the oxygen-containing gas and the hydrogen-containing gas which are thermally activated by non-plasma, are supplied to the substrate.

5. The method of claim 1, wherein in (b), an oxidation reaction of the first layer is not saturated.

6. The method of claim 1, wherein the specific element includes a semiconductor element or a metal element.

7. The method of claim 1, wherein the first source gas includes a chlorosilane-based source or a fluorosilane-based source gas, and the second source gas includes an aminosilane-based source gas.

8. The method of claim 1, wherein the specific element includes at least one selected from the group consisting of Si, Ti, Zr, Hf, Ta, Al and Mo.

9. The method of claim 1, wherein n is set to be an integer of two or more.

10. The method of claim 1, wherein a composition ratio of the film is controlled by controlling a gas supply time or an oxidizing power in (b).

11. A method of manufacturing a semiconductor device, comprising:
forming a film containing a specific element, oxygen, carbon and nitrogen or a film containing the specific element, oxygen and carbon on a substrate, by performing a cycle n times (n is an integer of one or more), the cycle including asynchronously performing:
(a) forming a first layer containing the specific element, carbon and nitrogen by performing a set m times (m is an integer of two or more), the set including asynchronously performing:
(a-1) supplying a first source gas containing the specific element and a halogen-group to the substrate;
(a-2) purging a residual gas including the first source gas on the substrate;
(a-3) supplying a second source gas containing the specific element and an amino-group to the substrate; and
(a-4) purging a residual gas including the second source gas on the substrate, and
(b) forming a second layer by oxidizing the first layer by supplying an oxygen-containing gas, or the oxygen-containing gas and a hydrogen-containing gas to the substrate.

12. The method of claim 11, wherein n is set to be an integer of two or more.

13. The method of claim 11, wherein a composition ratio of the film is controlled by controlling a gas supply time or an oxidizing power in (b).

14. A method of manufacturing a semiconductor device, comprising:
forming a film containing silicon, oxygen, carbon and nitrogen or a film containing silicon, oxygen and carbon on a substrate, by performing a cycle n times (n is an integer of one or more), the cycle including asynchronously performing:
(a) forming a first layer containing silicon, carbon and nitrogen by performing a set m times (m is an integer of two or more), the set including asynchronously performing:
(a-1) supplying a first source gas containing silicon and a halogen-group to the substrate;
(a-2) purging a residual gas including the first source gas on the substrate;
(a-3) supplying a second source gas containing silicon and an amino-group to the substrate; and
(a-4) purging a residual gas including the second source gas on the substrate, and
(b) forming a second layer by oxidizing the first layer by supplying an oxygen-containing gas, or the oxygen-containing gas and a hydrogen-containing gas to the substrate.

15. The method of claim 14, wherein n is set to be an integer of two or more.

16. The method of claim 14, wherein a composition ratio of the film is controlled by controlling a gas supply time or an oxidizing power in (b).

\* \* \* \* \*